United States Patent
Ju

(10) Patent No.: US 6,173,357 B1
(45) Date of Patent: Jan. 9, 2001

(54) EXTERNAL APPARATUS FOR COMBINING PARTIALLY DEFECTED SYNCHRONOUS DYNAMIC RANDOM ACCESS MEMORIES

(75) Inventor: Jiang-Tsuen Ju, Hsinchu (TW)

(73) Assignee: Shinemore Technology Corp., Hsinchu (TW)

( * ) Notice: Under 35 U.S.C. 154(b), the term of this patent shall be extended for 0 days.

(21) Appl. No.: 09/107,467

(22) Filed: Jun. 30, 1998

(51) Int. Cl.[7] ................................................. G06F 12/00
(52) U.S. Cl. ............................... 711/5; 711/105; 714/710
(58) Field of Search .......................... 365/230.03; 711/5, 711/105, 211; 714/5, 710

(56) References Cited

U.S. PATENT DOCUMENTS

| | | | |
|---|---|---|---|
| 4,366,535 | * 12/1982 | Cedolin et al. | 364/200 |
| 5,452,258 | * 9/1995 | Hotta | 365/230.03 |
| 5,537,665 | * 7/1996 | Patel et al. | 395/182.03 |
| 5,640,353 | * 6/1997 | Ju | 365/200 |
| 5,684,973 | * 11/1997 | Sullivan et al. | 395/405 |
| 5,701,270 | * 12/1997 | Rao | 365/230.03 |
| 5,764,575 | * 6/1998 | Kawai et al. | 365/200 |
| 5,793,942 | * 8/1998 | Shoji | 395/182.03 |
| 5,841,957 | * 11/1998 | Ju et al. | 395/182.06 |
| 5,943,693 | * 8/1999 | Barth | 711/220 |

* cited by examiner

Primary Examiner—Do Hyun Yoo
Assistant Examiner—Kevin Verbrugge
(74) Attorney, Agent, or Firm—Nath & Associates; Harold L. Novick

(57) ABSTRACT

The present invention discloses an apparatus for combining partially defected synchronous dynamic random access memories. By selecting each memory chip with corresponding workable blocks, the partially defected SDRAMs can be combined as a workable device which can be programmed and operated in the same way as a defect-free chip. The apparatus for combining partially defected synchronous dynamic random access memory chips of the present invention includes a workable block selecting circuit and a chip selecting circuit. The workable block selecting circuit is responsive to a reference signal for selecting workable blocks of the synchronous dynamic random access memories. The chip selecting circuit is responsive to a chip selecting signal and the reference signal for selecting a chip from the synchronous dynamic random access memory chips.

19 Claims, 21 Drawing Sheets

EXTERNAL APPARATUS FOR COMBINING PARTIALLY DEFECTED SYNCHRONOUS DYNAMIC RANDOM ACCESS MEMORIES

TECHNICAL FIELD OF THE INVENTION

The present invention relates to an apparatus for accessing synchronous dynamic random access memories. More specifically, the invention relates to an apparatus for combining partially defected synchronous dynamic random access memories.

BACKGROUND OF THE INVENTION

In the electric industry, memory devices are of vital applications in various kinds of system like computers and other peripherals. With the increasing demand on system operating speed and performance, more and more high speed and reliable memory devices are employed. DRAM (dynamic random access memory) is one of the most important devices in the semiconductor devices. In last decade, DRAM cells and chips are widely applied in computer systems for it's fast and reliable characteristics.

In the semiconductor manufacturing process of making memory chips, numerous processes are performed to make a great number of memory chips on a single wafer. Some defects may be found under the complex manufacturing steps and densely packed circuits. The undesired defects cause some of the memory chips to be defective ones and thus influence the yield of the products. However, most of the defective chips are only partially defected and a lot of workable cells are still left on the chips. By the design and the addition of external compensating circuits, two or more memory chips can be combined as a workable, defect-free one. Most of the partially defective chips can be merged to produce workable memory chips with undamaged functionality. Thus the cost can be reduced and the yield can be increased by reworking the defective chips to a workable one.

In system applications, DRAM can be classified into several types, like fast page mode DRAM, EDO (extended data output) DRAM, and SDRAM (synchronous DRAM). Various compensating method can be employed for combining defective fast page mode DRAM or EDO DRAM chips. In the U.S. Pat. No. 5,640,353 to the applicant of the present invention, an external compensation apparatus and method for fail bit DRAM is disclosed. The method is implemented by transforming and controlling address bits to replace defective bits. Referring to FIG. 1, the compensation apparatus has a tag address region 304, a compensation data region 305, a control logic 306, and a comparator 300. Thus bit defects of DRAM devices can be compensated to ensure the functionality of the system.

However, the address bit transforming and controlling scheme of the prior art method can not be applied on SDRAMs. In general, the operating mode of SDRAM cells are programmed by internal registers. The system has to program the registers of SDRAM cells by an address bus before operation. If the prior art external compensating scheme is used, a portion of the address of the SDRAM is fixed at a constant high or a constant low state. Some of the address are occupied and can not be used to program the internal registers. Thus the combined SDRAMs can not be operated by the conventional compensation scheme.

SUMMARY OF THE INVENTION

The present invention provides an apparatus for combining partially defected synchronous dynamic random access memories. By selecting each memory chip with corresponding workable blocks, the partially defected synchronous dynamic random access memories can be combined as a workable device for being programmed and operated in the same way as a defect-free chip.

An apparatus for combining partially defected synchronous dynamic random access memory chips of the present invention includes a workable block selecting circuit and a chip selecting circuit. The workable block selecting circuit is responsive to a reference signal for selecting workable blocks of the synchronous dynamic random access memories. The chip selecting circuit is responsive to a chip selecting signal and the reference signal for selecting a chip from the synchronous dynamic random access memory chips.

Nine embodiments corresponding to different defect modes of the memory chips are disclosed in the present invention. Corresponding to different defects modes, the reference signal can be a bank selecting signal, an address reference signal of row addresses, or an address reference signal of column addresses.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

Figure 1:
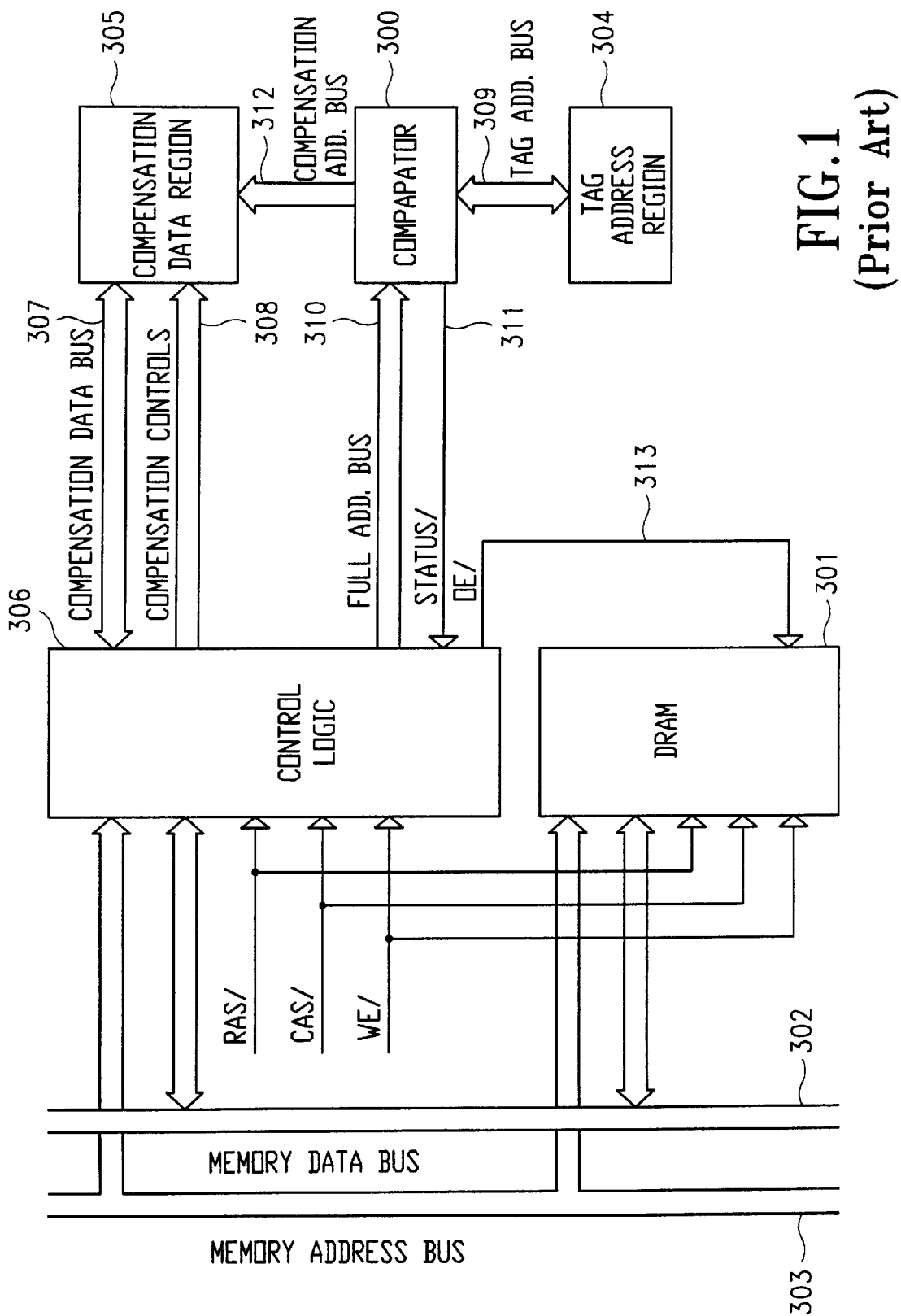
FIG. 1 illustrates a prior art external compensation apparatus for fail bit DRAM.

The present invention discloses an apparatus for combining partially defected synchronous dynamic random access memories. A compensating circuit is proposed for implementing the concept of transforming and programming address bit signals. By selecting each memory chip with corresponding workable blocks, the partially defected SDRAM can be combined as a workable device which can be programmed and operated in the same way as a defect-free chip. The internal registers of SDRAM can be programmed and the defects can be compensated as well. Thus two or more partially defected SDRAM chips can be combined as a functional, normally operated SDRAM chip.

In general, a memory chip can be divided into two blocks by the input of any one of address bits. The address bit can be a row address bit or a column address bit. The address bit to divide the chip into blocks is named as a reference bit. As the reference bit is set at a high state, only half of the data can be accessed by the system. In contrast, as the reference bit is set at a low state, only another half of the data can be accessed by the system. Therefore, all the half-workable memory chips can be selected out from defective memory chips by setting the reference bit to detect the functionality. The half-workable memory chips, namely the partially defected chips, can then be combined as a defect-free memory chip.

In the design of a SDRAM, memory cells are divided into two or four banks. A signal in selecting banks, BA, is a kind of address. During the programming of the internal registers, both the address bits and the bank selecting signal BA are a part of the operand code. The bank selecting signal is thus employed as one of the address. A chip may have one or more bank selecting bits as the bank selecting signal under different chip design. For example, one bank selecting bit, BA, is used for a SDRAM with a two banks design. Two bank selecting bits, BA0 and BA1, are used for a SDRAM with a four banks design.

A SDRAM with one bank selecting signal BA has two banks, bank A and bank B. Bank A is selected when BA is low and bank B is selected when BA is high. For adopting the compensating method and apparatus to SDRAM with various mode of defects, the reference signal can be the bank selecting signal BA, the row address signal, or the column address signal. Under the SDRAM specifications, there are several address-related cycles as follows:

1) register setting cycle;
2) bank active and row address accessing cycle;
3) column address latching cycle; and
4) precharge cycle.

The simplified truth table of the above-identified cycles is given below.

| CYCLE | CS/ | RAS/ | CAS/ | WE/ | BA's | Address |
|---|---|---|---|---|---|---|
| Resister Setting | L | L | L | L | | OP Codes |
| Bank Active & Row Address | L | L | H | H | Valid | Row Address |
| Column Address Latching | L | H | L | H/L | Valid | Column Address |
| Pre-charge | L | L | H | L | Valid | Don't Care |

In the above table, "CS/" represents chip selecting signal, "RAS/" represents row address strobe, "CAS/" represents column address strobe, and "WE/" is write enable signal. A chip is operated only when CS/ is low. When two or more chips are combined, CS/ can be used to select the chip to be operated. For the combined chips, the reference signal can be BA, the row address, or the column address. To operate the combined chips as one defect-free chip, all the signals must work in the same way as a single chip. The address bit of the reference signal is processed only in data reading and writing cycles.

Figure 2:
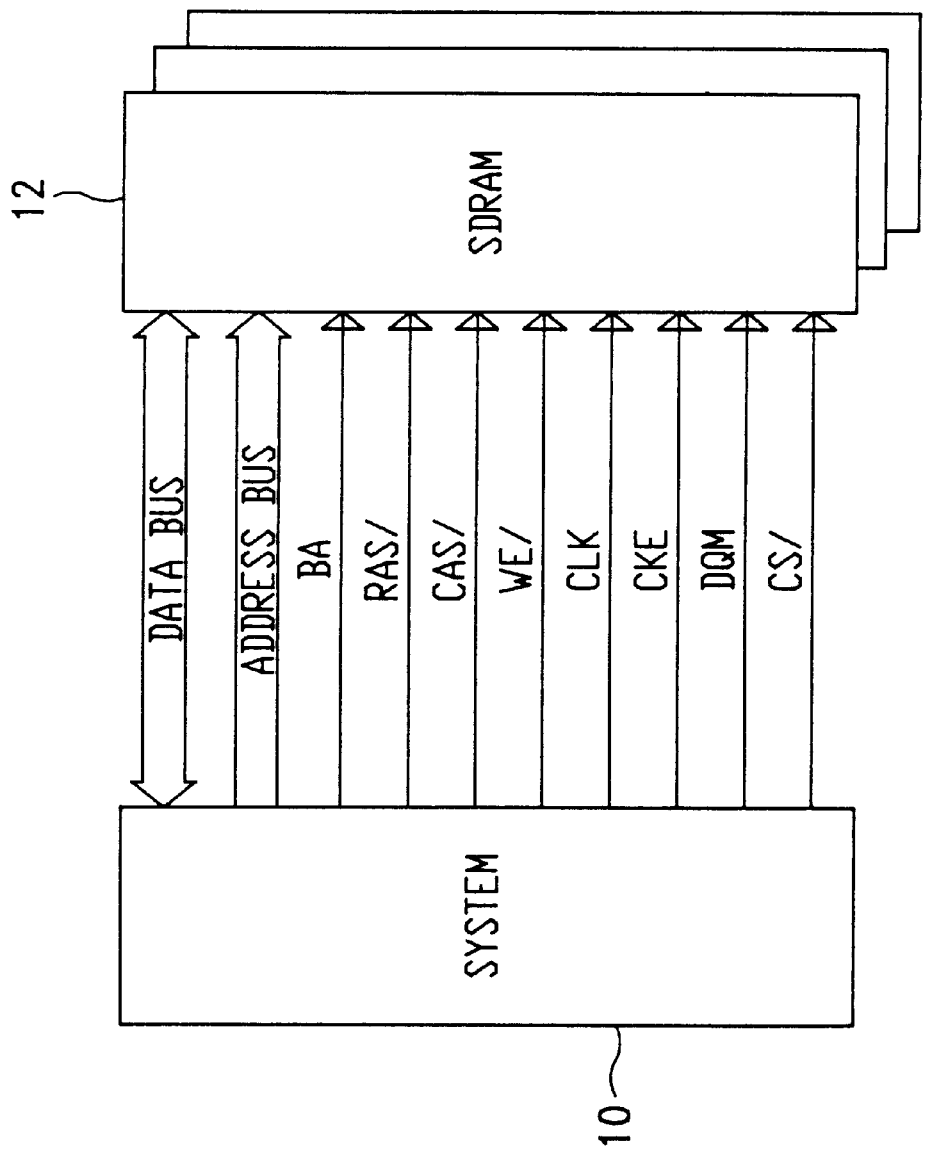
FIG. 2 illustrates a schematic figure of the connection between a system and a SDRAM chip.
Figure 3:
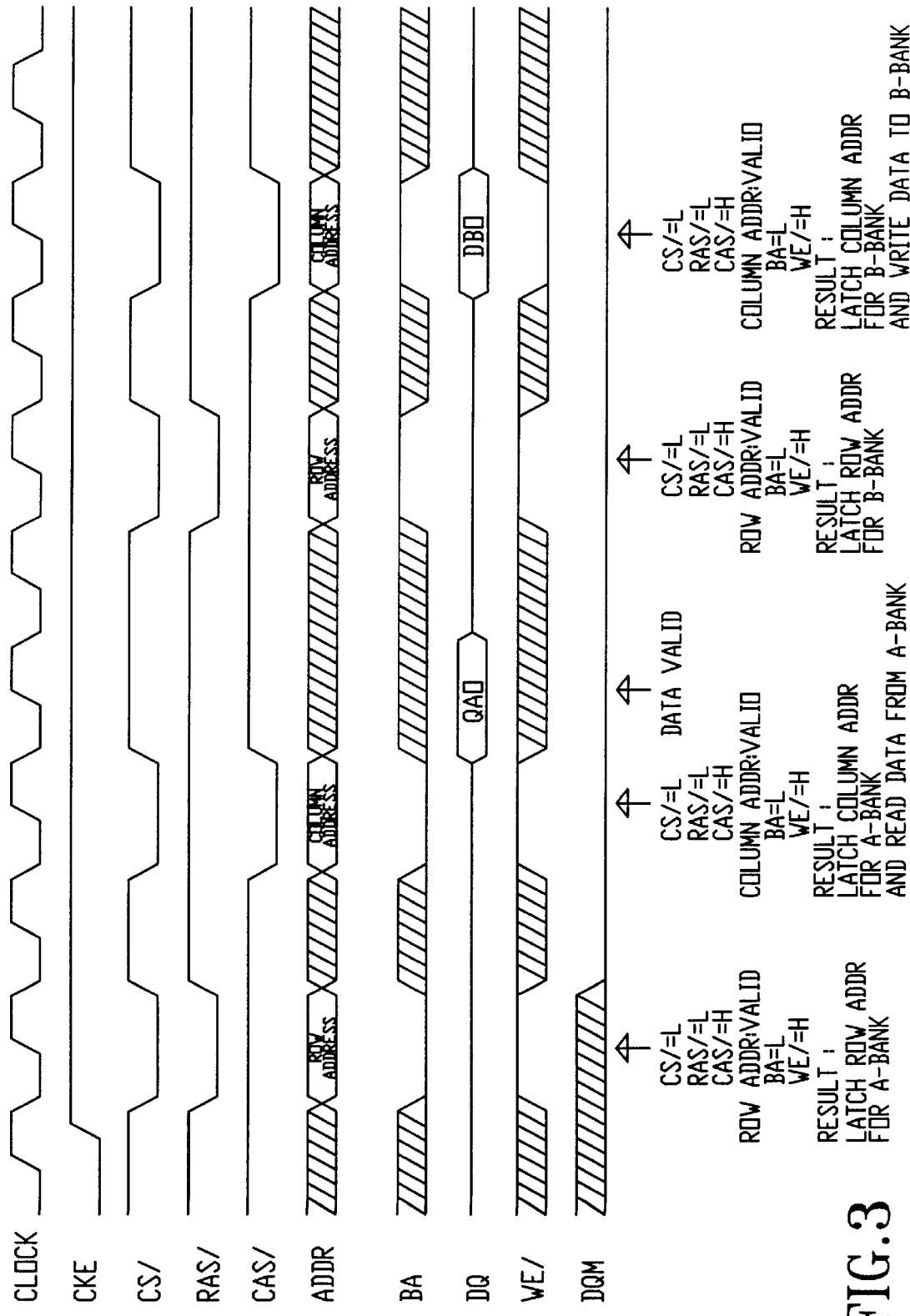
FIG. 3 illustrates a timing diagram of the SDRAM operation.

Turning to FIG. 2, a schematic figure of the connection between a system 10 and one or more SDRAM chips 12 is illustrated. A timing diagram of the SDRAM operation is given in FIG. 3. As indicated, the system 10 sends the row address and the column address at different time by common pins. BA is sent to select a bank when the system 10 is sending the row address and the column address. In the compensation by external circuits, several cases of applying the reference signal must be considered. A bank selecting signal BA can be employed as the reference signal, a row address signal or a column address signal can also be used as the reference signal as well.

Figure 4:
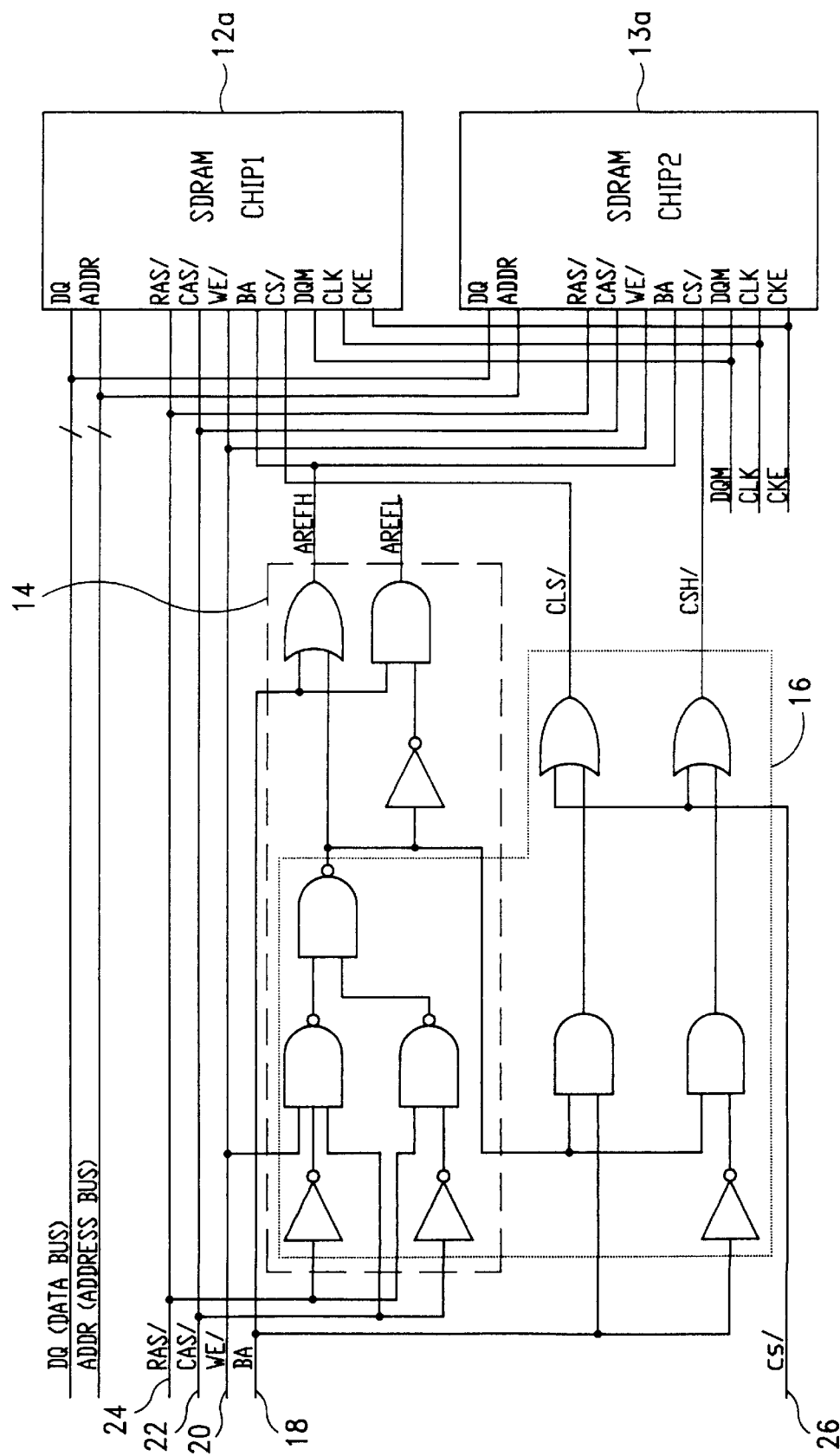
FIG. 4 illustrates a first embodiment of the apparatus for combining partially defected synchronous dynamic random access memory chips in accordance with the present invention.

Referring to FIG. 4, the apparatus for combining partially defected synchronous dynamic random access memory chips of the present invention is illustrated. Without limiting the scope of the present invention, the application of combining two SDRAM chips 12a and 13a is described. The apparatus for combining partially defected memories has a workable block selecting circuit 14 and a chip selecting circuit 16. The workable block selecting circuit 14 is responsive to a reference signal 18, a write enable signal 20, a column address signal 22, and a row address signal 24. By combining the inputs, the workable block selecting circuit 14 is used to select the workable blocks or regions of the SDRAM chips 12a and 13a. The workable blocks are selected by connecting a bank selecting pin or a reference address pin of the chips. The connections depend on the defect mode of the chips. The chip selecting circuit 16 is responsive to a chip selecting signal 26, the reference signal 18, the write enable signal 20, the column address signal 22, and the column address signal 24. By the activation of the signals, the chip selecting circuit 16 is employed to select a chip from the combined chips. Thus the chip selected can be operated with its workable blocks.

In the first embodiment of the present invention as indicated in FIG. 4, the SDRAM chips 12a and 13a have partial workable banks. A bank selecting signal (BA) from the system is used as the reference signal 18. If two chips 12a and 13a are identified to be operable only when BA's are high, the A-banks of the two chips 12a and 13a are defective. The B-banks of the two chips 12a and 13a are workable and can be selected by connecting a signal AREFH of the workable block selecting circuit 14 to the bank selecting signal BA of each chip.

When the row address signal (RAS/) 24 is at a low state and both the column address signal (CAS/) 22 and the write enable signal (WE/) 20 are at a high state, the system is in a row address accessing cycle, as indicated in the truth table described above. When the row address signal (RAS/) 24 is at a high state and the column address signal (CAS/) 22 is at a low state, the system is in a column address accessing cycle. In both cycles, the output signal AREFH of the workable block selecting circuit 14 is kept high disregarding the state of BA 18 from the system 10. The output signal AREFL is kept low in the same way. Since BA's of the chip 12a and 13a are connected to the output signal AREFH to be maintained at high, the defective A-banks are not accessed. Thus the workable B-banks of the chips 12a and 13a are activated by the workable block selecting circuit 14 through the signal AREFH in the row address accessing and the column address accessing cycles.

For avoiding accessing the B-banks of the chip 12a and 13a at the same time, the chip selecting circuit 16 is employed. The chip selecting pins (CS/) of the chip 12a and the chip 13a are controlled respectively by a controlling signal CSL/ and a controlling signal CSH/, which are generated by the chip selecting circuit 16. When the reference signal 18 (BA) of the system 10 is high, CSH/ is low under a low CS/ and only the chip 13a is accessed. The chip 12a is not accessed since CSL/ is forced to be high. When the reference signal 18 (BA) of the system 10 is low, CSL/ is low under a low CS/ and only the chip 12a is accessed. The chip 13a is not accessed since CSH/ is forced to be high. Therefore, during the row address accessing and the column address accessing cycles, a corresponding chip is selected by the chip selecting circuit 16 at each state of the bank selecting signal (BA) 18 of the system.

Figure 5:
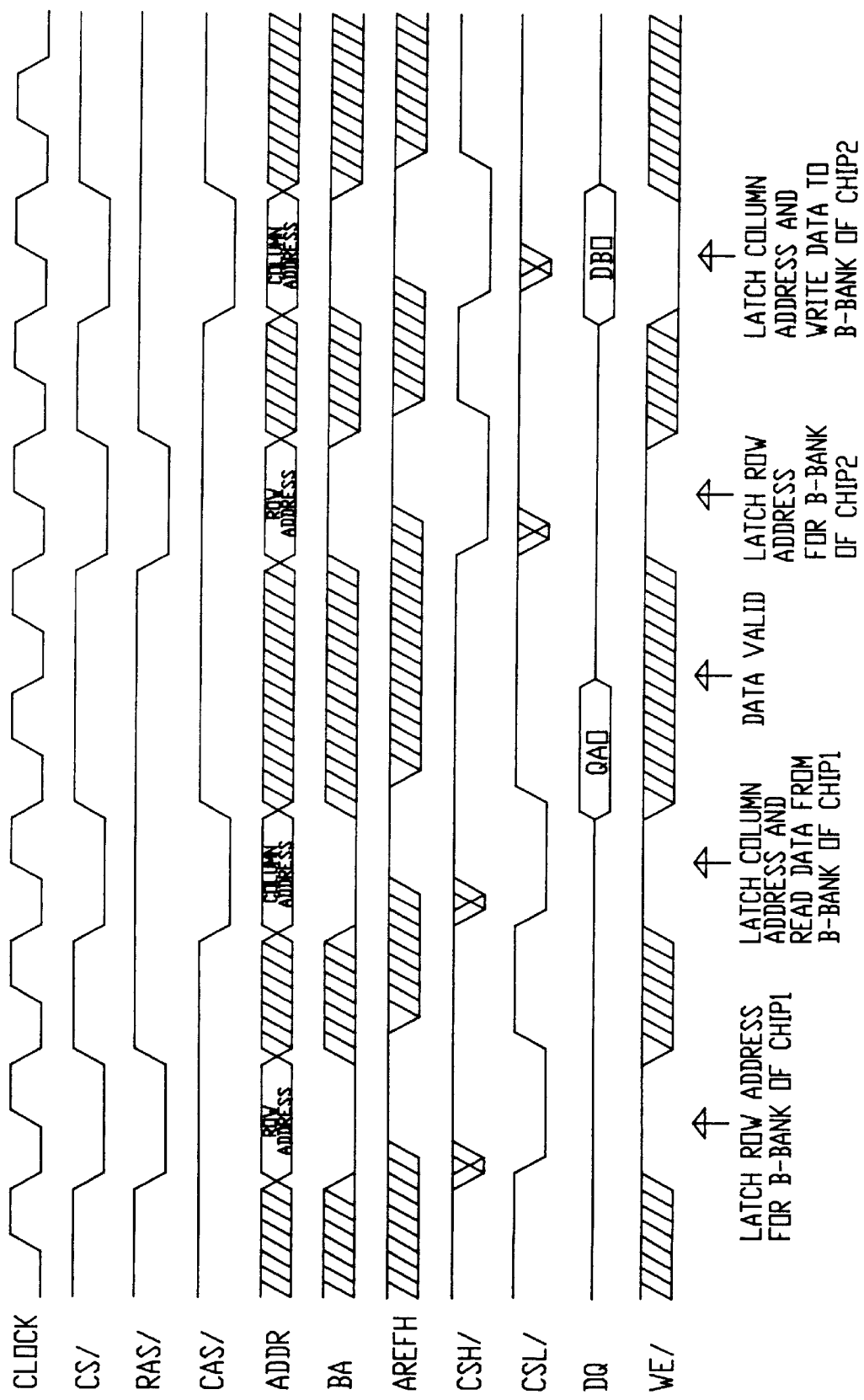
FIG. 5 illustrates a timing diagram of the first embodiment operation in accordance with the present invention.

In view of the system 10, workable banks can be accessed in both the high state and the low state of the system bank selecting signal BA. The chips 12a and 13a are combined as a defect-free chip to the system 10, disregarding of the partial bank defects. In non-row address accessing and non-column address accessing cycles, the output signal AREFH and AREFL are equal to BA and the controlling signal CSH/ and CSL/ are equal to CS/ from the system 10. Therefore, the combined chip can be operated exactly the same as a single chip in the register setting or precharge cycles. The workable block selecting circuit 14 and the chip selecting circuit 16 can be implemented with other circuits to perform the above-described logic operations. The timing diagram of the circuit in FIG. 4 is illustrated in FIG. 5 as a reference.

Figure 6:
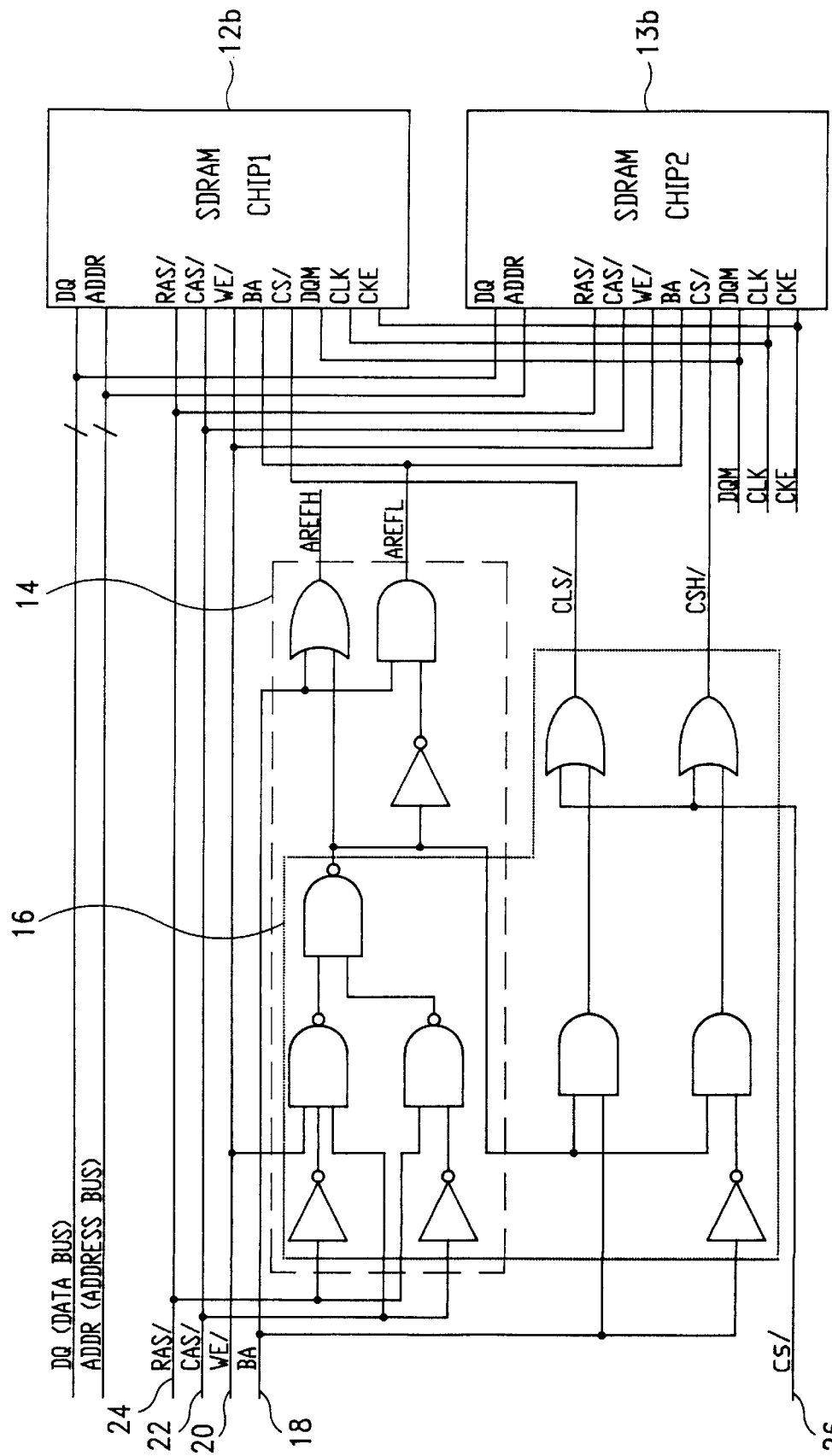
FIG. 6 illustrates a second embodiment of the apparatus for combining partially defected synchronous dynamic random access memory chips in accordance with the present invention.

Referring to FIG. 6 as a second embodiment, if two chips 12b and 13b are identified to be operable only when BA's are low, the B-banks of the two chips 12b and 13b are defective. The A-banks of the two chips 12b and 13b are workable and can be selected by connecting a signal AREFL of the workable block selecting circuit 14 to the bank selecting signal BA of each chip. The reference signal 18 of the workable block selecting circuit 14 is connected with the bank selecting signal BA from the system 10 in the case.

Figure 7:
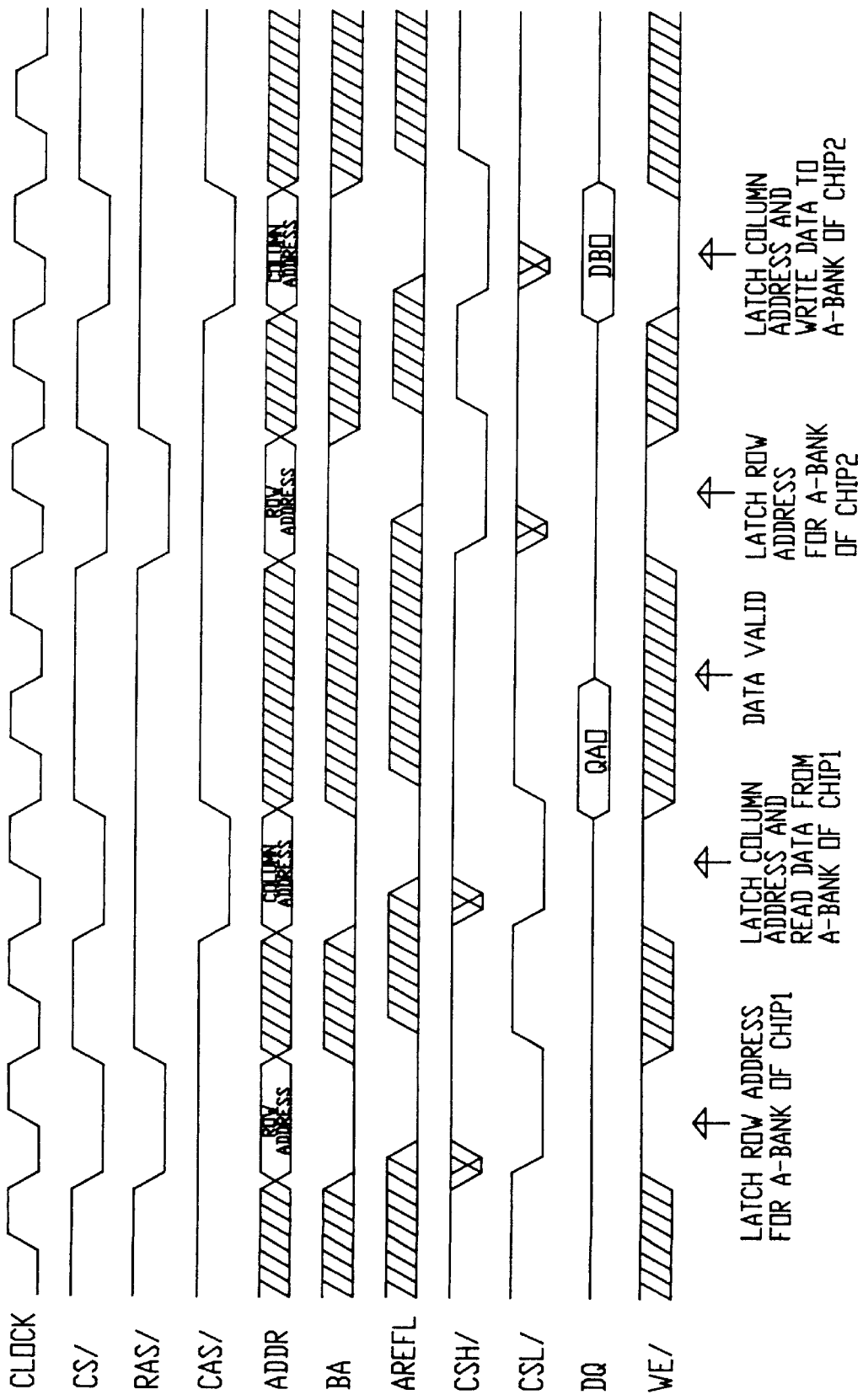
FIG. 7 illustrates a timing diagram of the second embodiment operation in accordance with the present invention.

Thus, the workable A-banks of the chips 12b and 13b can be activated by the workable block selecting circuit 14 through the signal AREFL in the row address accessing and the column address accessing cycles. During the two cycles, a corresponding chip is selected by the chip selecting circuit 16 at each state of the bank selecting signal (BA) 18 of the system 10, in the same way as the first embodiment in FIG. 4. The operations in non-row address accessing and non-column address accessing cycles are remained unchanged and thus the combined chip can be operated exactly the same as a single chip in the register setting or precharge cycles. The timing diagram of the circuit in FIG. 6 is illustrated in FIG. 7 as a reference.

Figure 8:
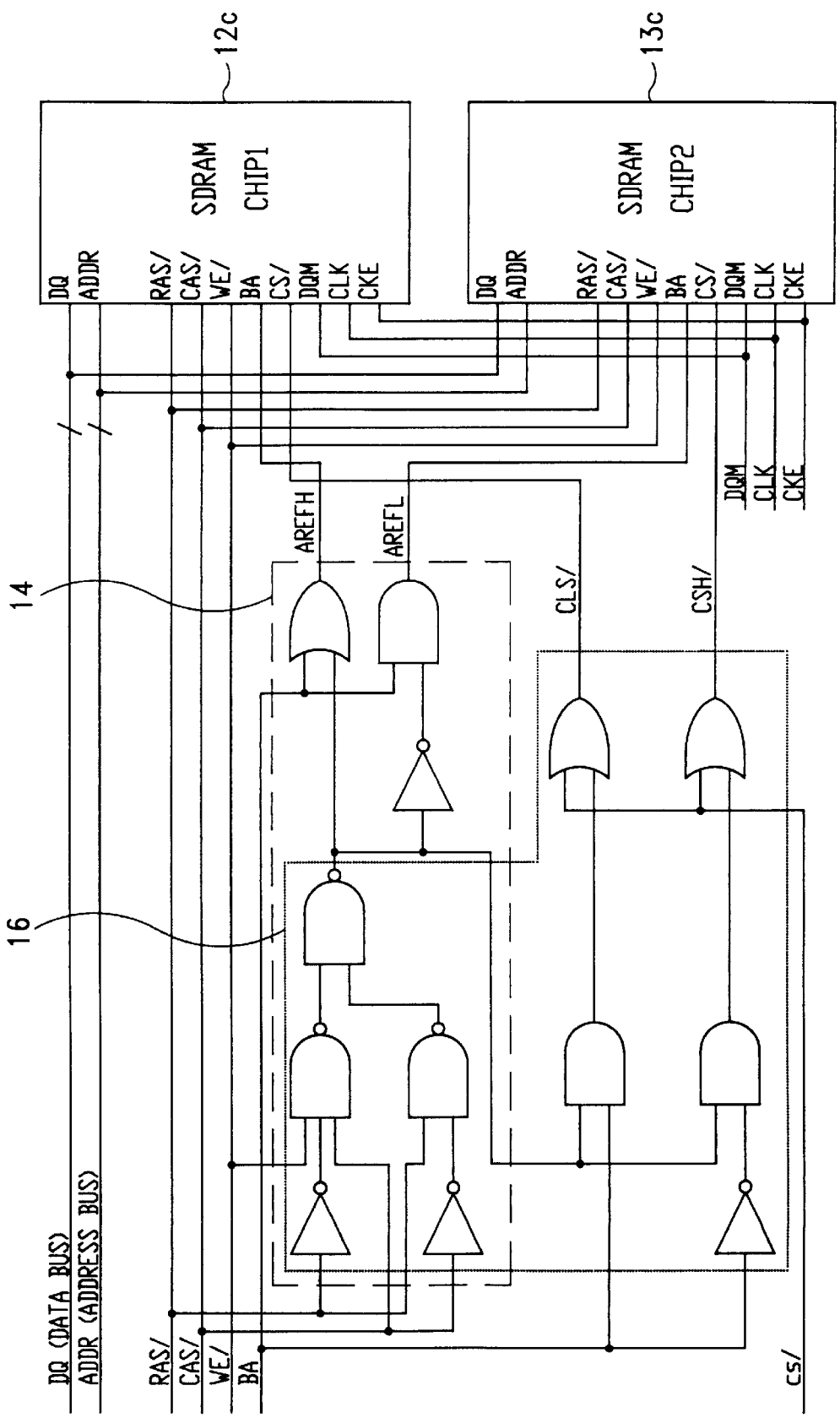
FIG. 8 illustrates a third embodiment of the apparatus for combining partially defected synchronous dynamic random access memory chips in accordance with the present invention.

Referring to FIG. 8 as a third embodiment, if a chip 12c is identified to be operable only when BA is high, the A-bank of the chips 12c is defective. If a chip 13c is identified to be operable only when BA is low, the B-bank of the chips 13c is defective. The B-bank the chip 12c and the A-bank of the chip 13c are workable. The B-bank of chip 12c can be selected by connecting a signal AREFH of the workable block selecting circuit 14 to the bank selecting signal BA of the chip 12c. The A-bank of the chip 13c can be selected by connecting a signal AREFL of the workable block selecting circuit 14 to the bank selecting signal BA of the chip 13c. The reference signal 18 of the workable block selecting circuit 14 is connected with the bank selecting signal BA from the system 10 in the case.

Figure 9:
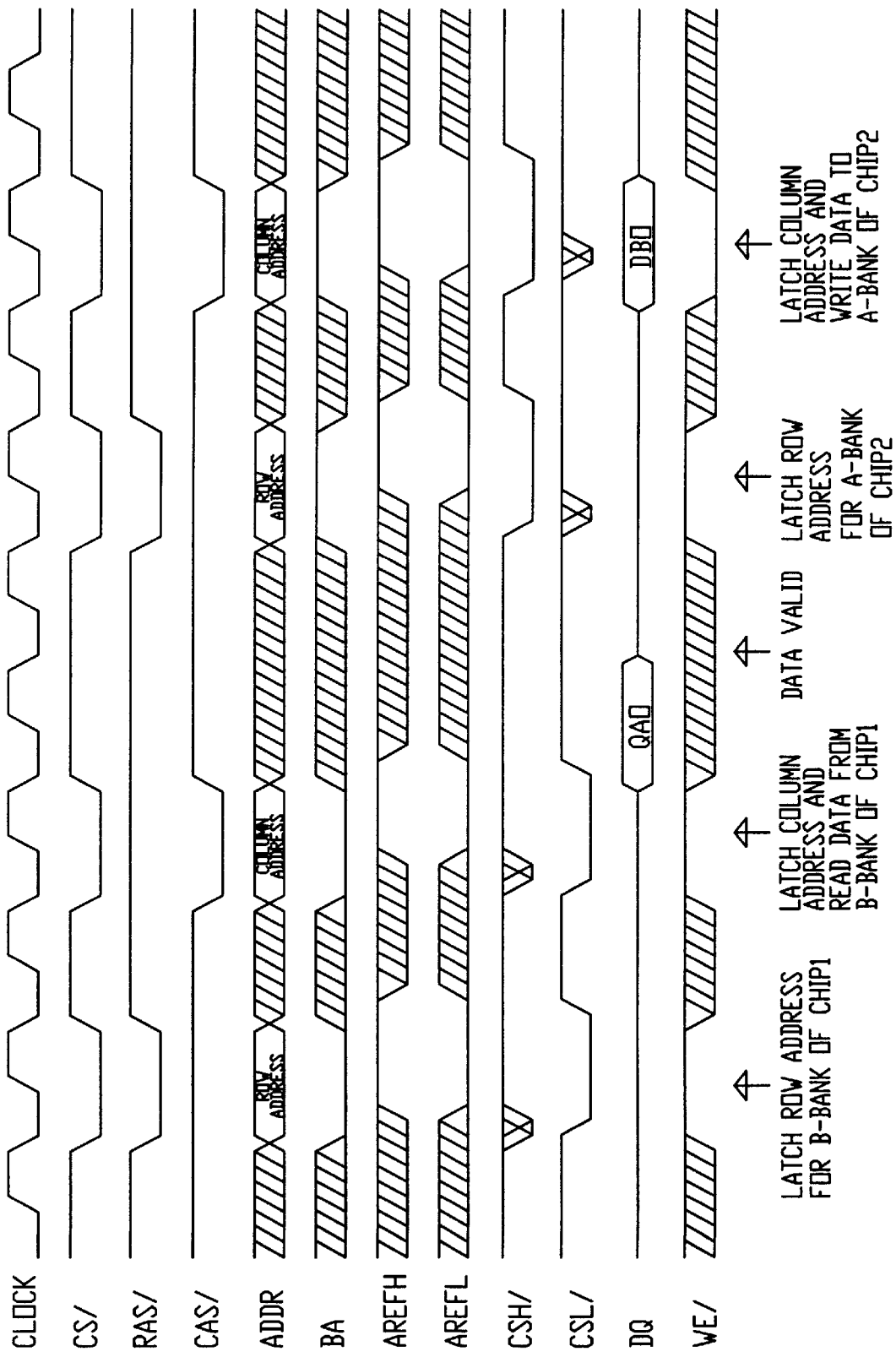
FIG. 9 illustrates a timing diagram of the third embodiment operation in accordance with the present invention.

Thus, the workable B-bank of the chip 12c and the workable A-bank of the chip 13c can be activated by the workable block selecting circuit 14 through the signal AREFH and AREFL in the row address accessing and the column address accessing cycles. During the two cycles, a corresponding chip is selected by the chip selecting circuit 16 at each state of the bank selecting signal (BA) 18 of the system, in the same way as the first embodiment in FIG. 4. The operations in non-row address accessing and non-column address accessing cycles are remained unchanged and thus the combined chip can be operated exactly the same as a single chip in the register setting or precharge cycles. The timing diagram of the circuit in FIG. 8 is illustrated in FIG. 9 as a reference.

Figure 10:
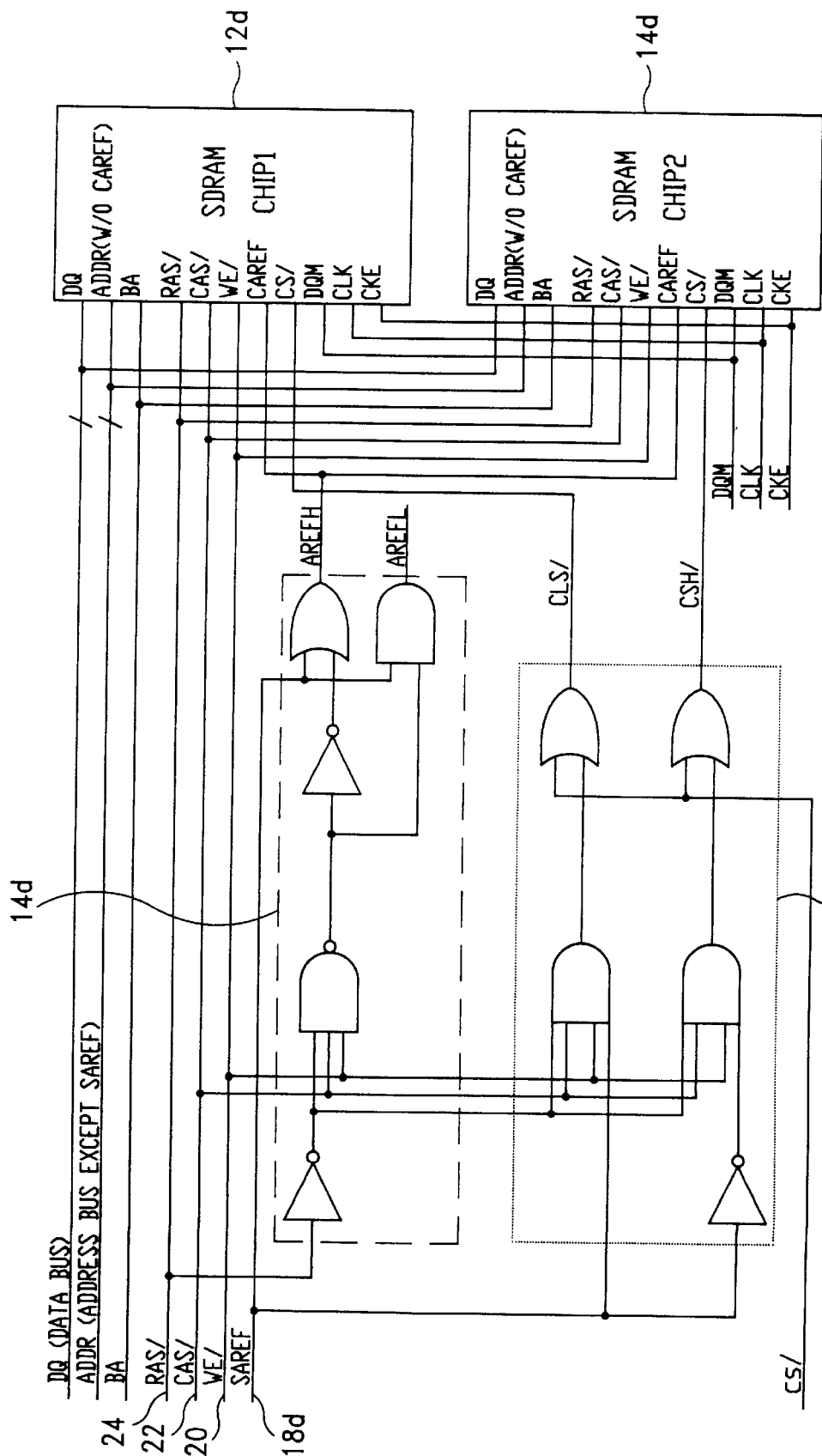
FIG. 10 illustrates a fourth embodiment of the apparatus for combining partially defected synchronous dynamic random access memory chips in accordance with the present invention.

In the fourth embodiment of the present invention as indicated in FIG. 10, the SDRAM chips 12d and 13d have partial workable blocks under different states of the address signal. A row address reference signal (SAREF) of row addresses from the system is used as the reference signal 18d. An row address reference signal pin of the row addresses of the chip is represented by CAREF. The two chips 12d and 13d are identified to be operable when the CAREF of row addresses are high, and are unworkable when the CAREF of the row addresses are low. Therefore, partial blocks of the two chips 12d and 13d are defective. The workable blocks of the two chips 12d and 13d can be selected by connecting a signal AREFH of a workable block selecting circuit 14d to the address reference signal pin, CAREF, of each chip.

When the row address signal (RAS/) 24 is at a low state and both the column address signal (CAS/) 22 and the write enable signal (WE/) 20 are at a high state, the system is in a row address accessing cycle, as indicated in the truth table described above. In the row address accessing cycle, the output signal AREFH of the workable block selecting circuit 14d is kept high and the output signal AREFL of the workable block selecting circuit 14d is kept low, disregarding the state of SAREF 18d from the system 10. Since CAREF of the chips 12d and 13d are connected to the output signal AREFH to be maintained at high, the defective blocks of the both chips are not accessed. Thus the workable blocks of the chips 12d and 13d are activated by the workable block selecting circuit 14d through the signal AREFH in the row address accessing cycle. When the row address signal (RAS/) 24a is at a high state and the column address signal (CAS/) 22 is at a low state, the system is in a column address accessing cycle. The SAREF signal can be send to the CAREF of the chips 12d and 13d, as the usual operation in a single chip.

For avoiding accessing the workable blocks of the chip 12d and 13d at the same time, the chip selecting circuit 16d is employed. The chip selecting pins (CS/) of the chip 12d and the chip 13d are controlled respectively by a controlling signal CSL/ and a controlling signal CSH/, which are generated by the chip selecting circuit 16d. When the SAREF 18d of the system 10 is high, CSH/ is low under a low CS/ and only the chip 13d is accessed. The chip 12d is not accessed since CSL/ is forced to be high. When the SAREF 18d of the system 10 is low, CSL/ is low under a low CS/ and only the chip 12d is accessed. The chip 13d is not accessed since CSH/ is forced to be high. Therefore, a corresponding chip is selected by the chip selecting circuit 16 at each state of the SAREF 18d of the system.

Figure 11:
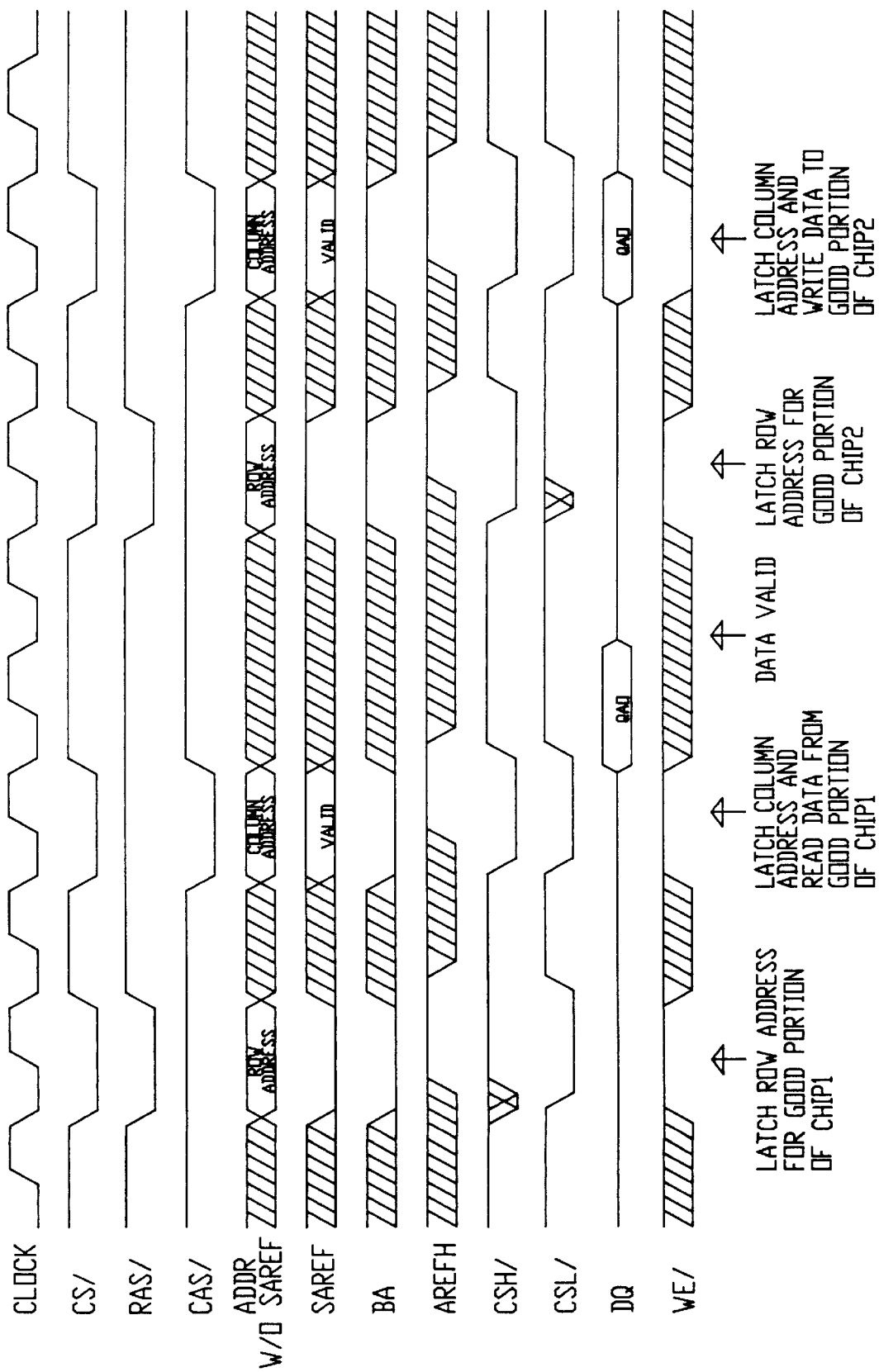
FIG. 11 illustrates a timing diagram of the fourth embodiment operation accordance with the present invention.

In view of the system 10, the workable banks can be accessed in both the high state and the low state of the SAREF 18d. The chips 12d and 13d are combined as a defect-free chip to the system 10, disregarding of the partial defective blocks. In non-row address accessing cycles, the state of the output signals AREFH and AREFL are equal to the state of the SAREF 18d and the controlling signal CSH/ and CSL/ are equal to the state of the CS/ from the system 10. Therefore, the combined chips can be operated exactly the same as a single chip in the register setting or precharge cycles. The workable block selecting circuit 14d and the chip selecting circuit 16d can be implemented with various kinds of circuits to perform the above-described logic operations to select corresponding chips and workable blocks. The timing diagram of the circuit in FIG. 10 is illustrated in FIG. 11 as a reference.

Figure 12:
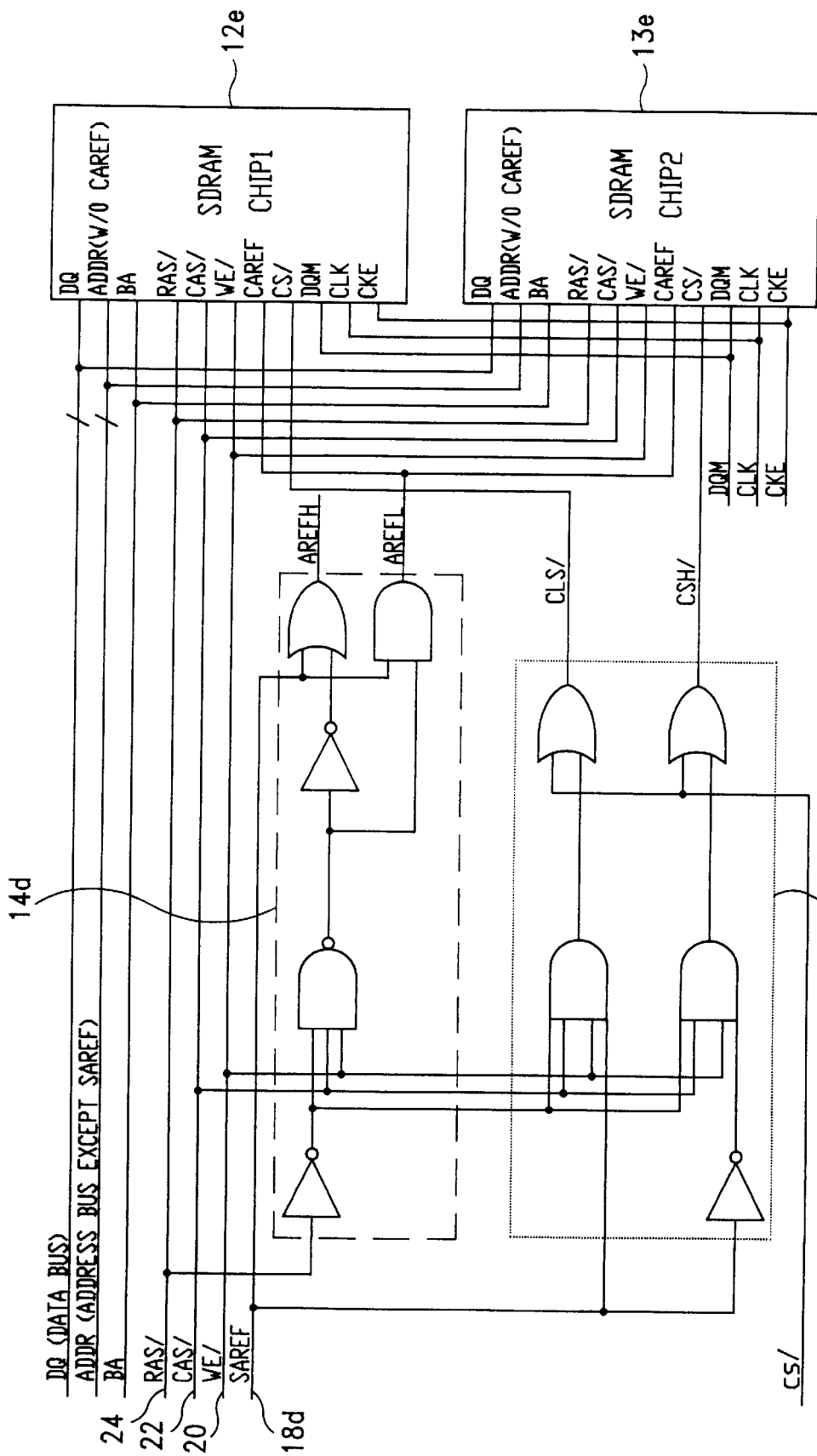
FIG. 12 illustrates a fifth embodiment of the apparatus for combining partially defected synchronous dynamic random access memory chips in accordance with the present invention.

Referring to FIG. 12 as a fifth embodiment, if the two chips 12e and 13e are identified to be operable only when CAREF are low, partial blocks of the two chips are defective. The workable blocks of the two chips 12c and 13e can be selected by connecting a signal AREFL of the workable block selecting circuit 14d to the address reference signal pin, CAREF, of each chip. The address reference signal (SAREF) of the row addresses from the system is used as the reference signal 18d in the case.

Figure 13:
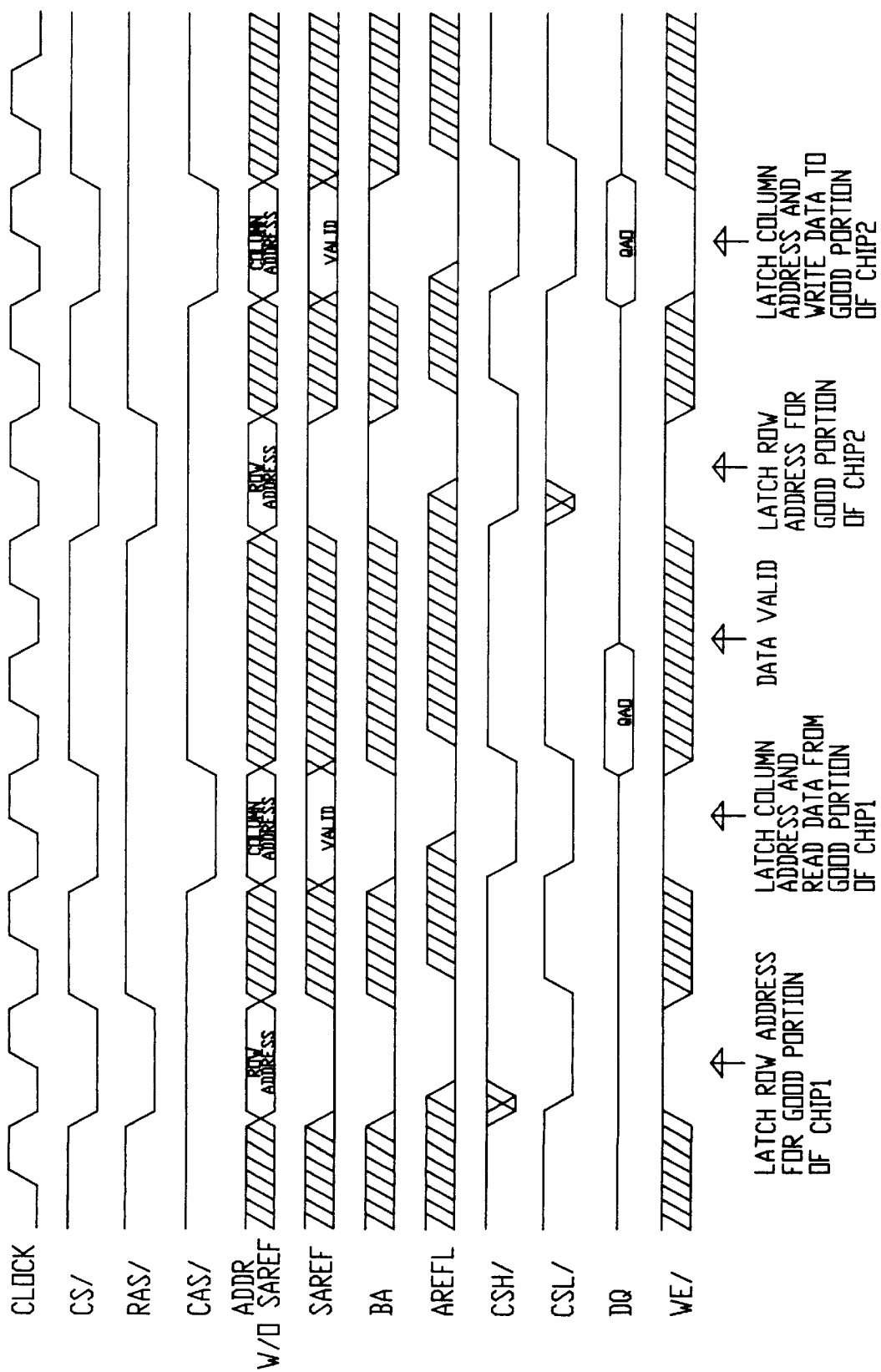
FIG. 13 illustrates a timing diagram of the fifth embodiment operation in accordance with the present invention.

Thus, the workable blocks of the chips 12e and 13e can be activated by the workable block selecting circuit 14d through the signal AREFL in the row address accessing cycle. During the cycle, a corresponding chip is selected by the chip selecting circuit 16d at each state of the address reference signal (SAREF) 18d of the system, in the same way as the fourth embodiment in FIG. 10. The operations in non-row address accessing cycles are remained unchanged and thus the combined chips can be operated exactly the same as a single chip in the register setting or precharge cycles. The timing diagram of the circuit in FIG. 12 is illustrated in FIG. 13 as a reference.

Figure 14:
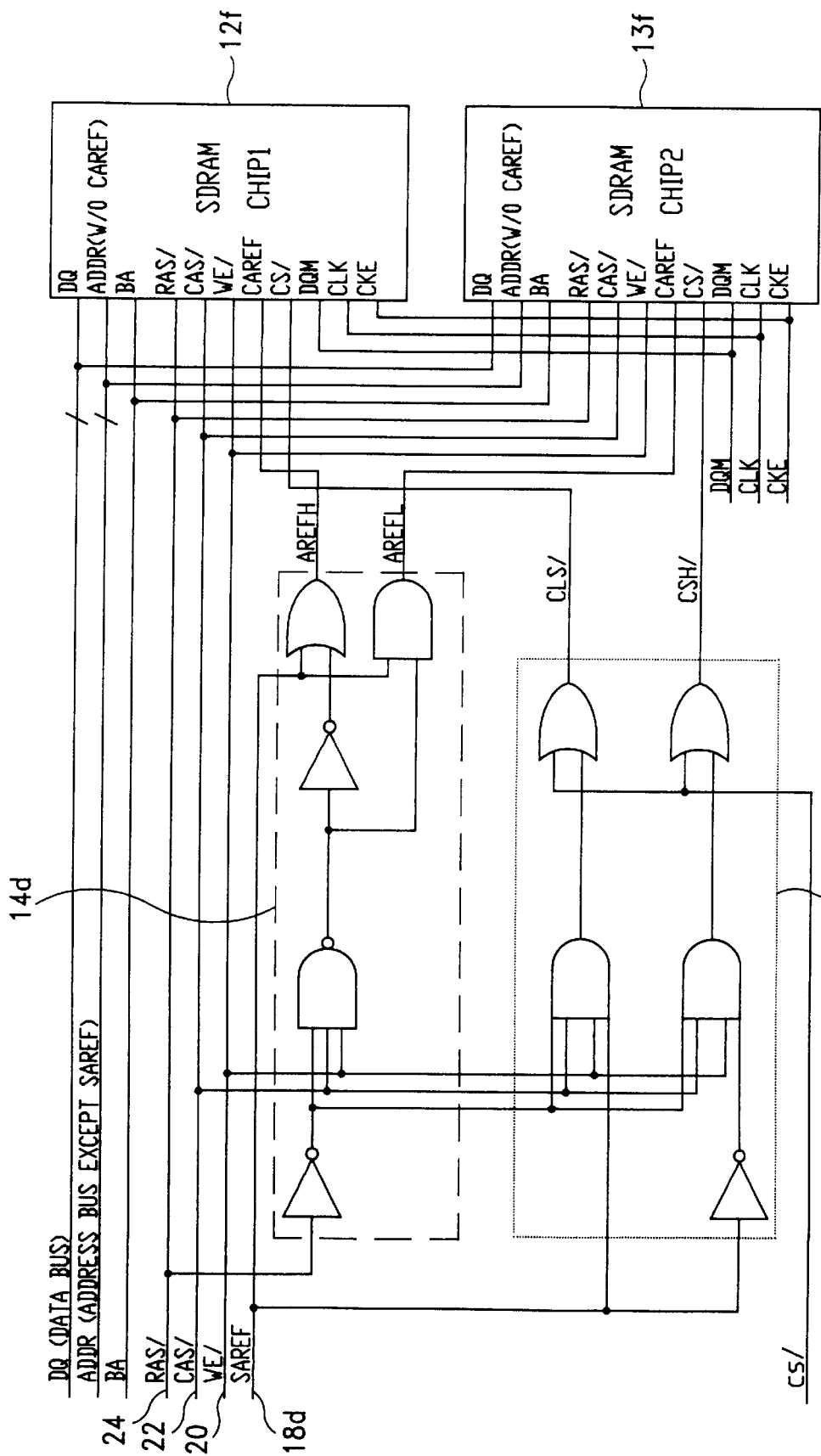
FIG. 14 illustrates a sixth embodiment of the apparatus for combining partially defected synchronous dynamic random access memory chips in accordance with the present invention.

Referring to FIG. 14 as a sixth embodiment, if a chip 12f is identified to be operable only when CAREF is high and a chip 13f is identified to be operable only when CAREF is low, partial blocks of the two chips 12f and 13f are defective. The workable block of the chips 12f can be selected by connecting a signal AREFH of the workable block selecting circuit 14 to the address reference signal pin CAREF of the chip 12f. The workable block of the chips 13f can be selected by connecting a signal AREFL of the workable block selecting circuit 14 to the address reference signal pin CAREF of the chip 13f. The address reference signal (SAREF) of the row addresses from the system 10 is used as the reference signal 18d in the case.

Figure 15:
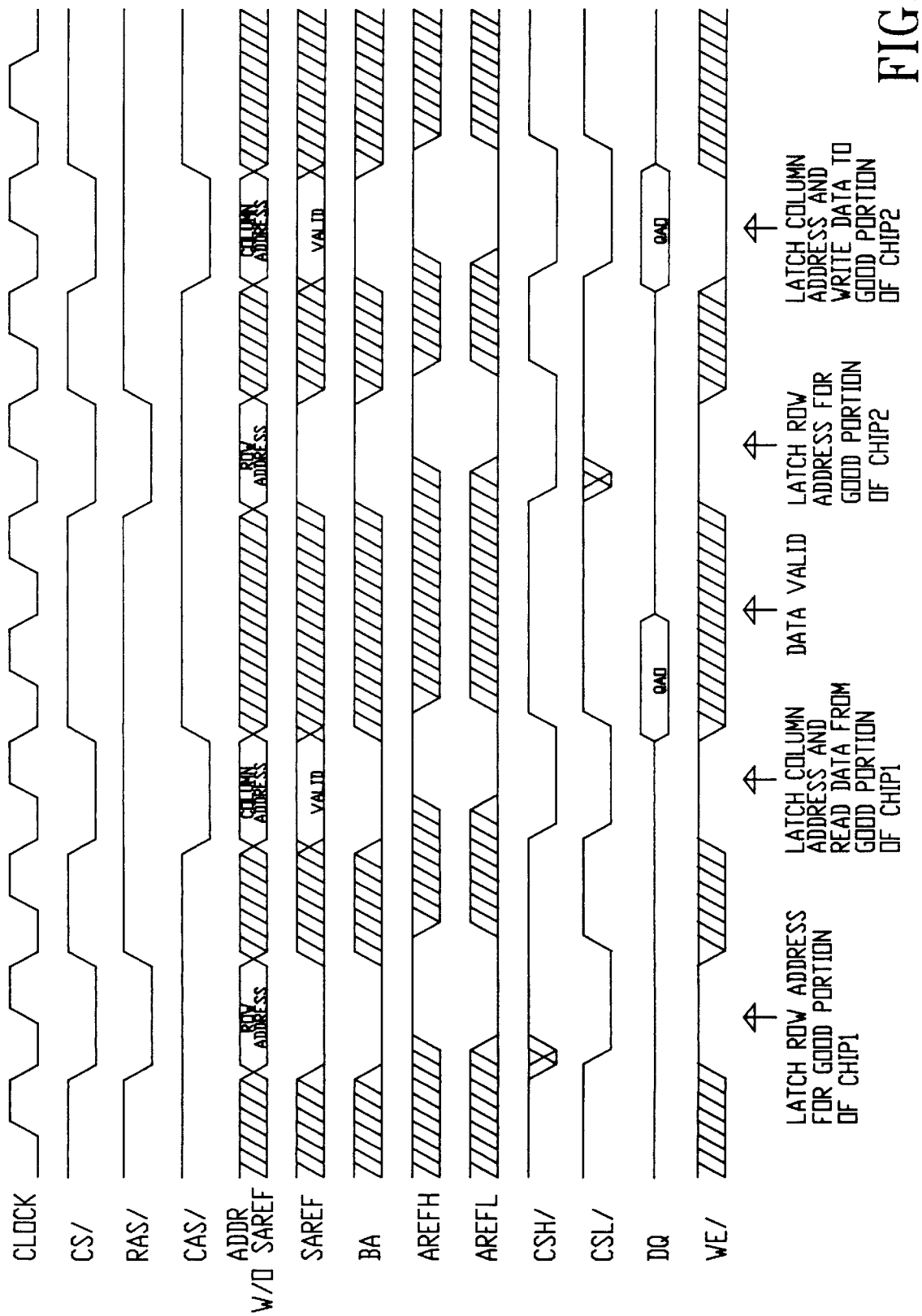
FIG. 15 illustrates a timing diagram of the sixth embodiment operation in accordance with the present invention.

Thus, the workable blocks of the chips 12f and 13f can be activated by the workable block selecting circuit 14d through the signal AREFH and AREFL in the row address accessing. During the cycle, a corresponding chip is selected by the chip selecting circuit 16d at each state of the address signal (SAREF) 18d of the system, in the same way as the fourth embodiment in FIG. 10. The operations in non-row address accessing cycles are remained unchanged and thus the combined chips can be operated exactly the same as a single chip in the register setting or precharge cycles. The timing diagram of the circuit in FIG. 14 is illustrated in FIG. 15 as a reference.

Figure 16:
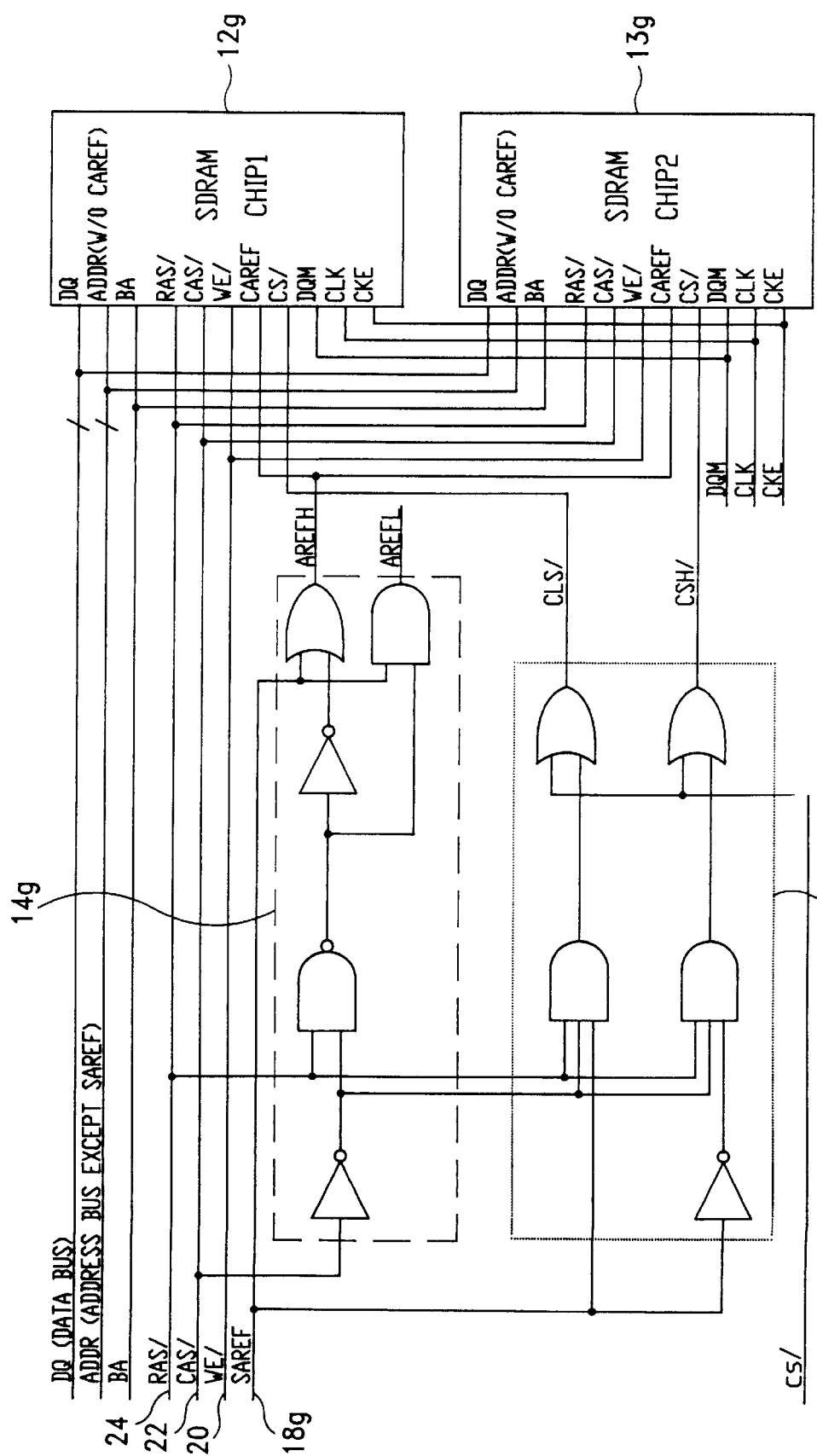
FIG. 16 illustrates a seventh embodiment of the apparatus for combining partially defected synchronous dynamic random access memory chips in accordance with the present invention.

In the seventh embodiment of the present invention as indicated in FIG. 16, the SDRAM chips 12g and 13g have partial workable blocks under different states of the address signal. An address reference signal (SAREF) of column addresses from the system 10 is used as the reference signal 18g. An address reference signal pin of the column addresses of the chip is represented by CAREF. The two chips 12g and 13g are identified to be operable when the CAREF of the column address are high, and are unworkable when the CAREF of the column address are low. Therefore, partial blocks of the two chips 12g and 13g are defective. The workable blocks of the two chips 12g and 13g can be selected by connecting a signal AREFH of a workable block selecting circuit 14d to the address reference signal pin, CAREF, of each chip.

When the column address signal (CAS/) 22 is at a low state and the row address signal (RAS/) 24 is at a high state, the system is in a column address accessing cycle, as indicated in the truth table described above. In the column address accessing cycle, the output signal AREFH of the workable block selecting circuit 14g is kept high and the output signal AREFL of the workable block selecting circuit 14g is kept low, disregarding the state of SAREF 18g from the system 10. Since CAREF of the chips 12g and 13g are connected to the output signal AREFH to be maintained at high, the defective blocks of the both chips are not accessed. Thus the workable blocks of the chips 12g and 13g are activated by the workable block selecting circuit 14g through the signal AREFH in the column address accessing cycle. During row address accessing, the SAREF signal can be send to the CAREF of the chips 12g and 13g, as the usual operation in a single chip.

For avoiding accessing the workable blocks of the chips 12g and 13g at the same time, the chip selecting circuit 16g is employed. The chip selecting pins (CS/) of the chip 12g and the chip 13g are controlled respectively by a controlling signal CSL/ and a controlling signal CSH/, which are generated by the chip selecting circuit 16g. When the SAREF 18g of the system 10 is high, CSH/ is low under a low CS/ and only the chip 13g is accessed. The chip 12g is not accessed since CSL/ is forced to be high. When the SAREF 18g of the system 10 is low, CSL/ is low under a low CS/ and only the chip 12g is accessed. The chip 13g is not accessed since CSH/ is forced to be high. Therefore, a corresponding chip is selected by the chip selecting circuit 16g at each state of the SAREF 18g of the system.

Figure 17:
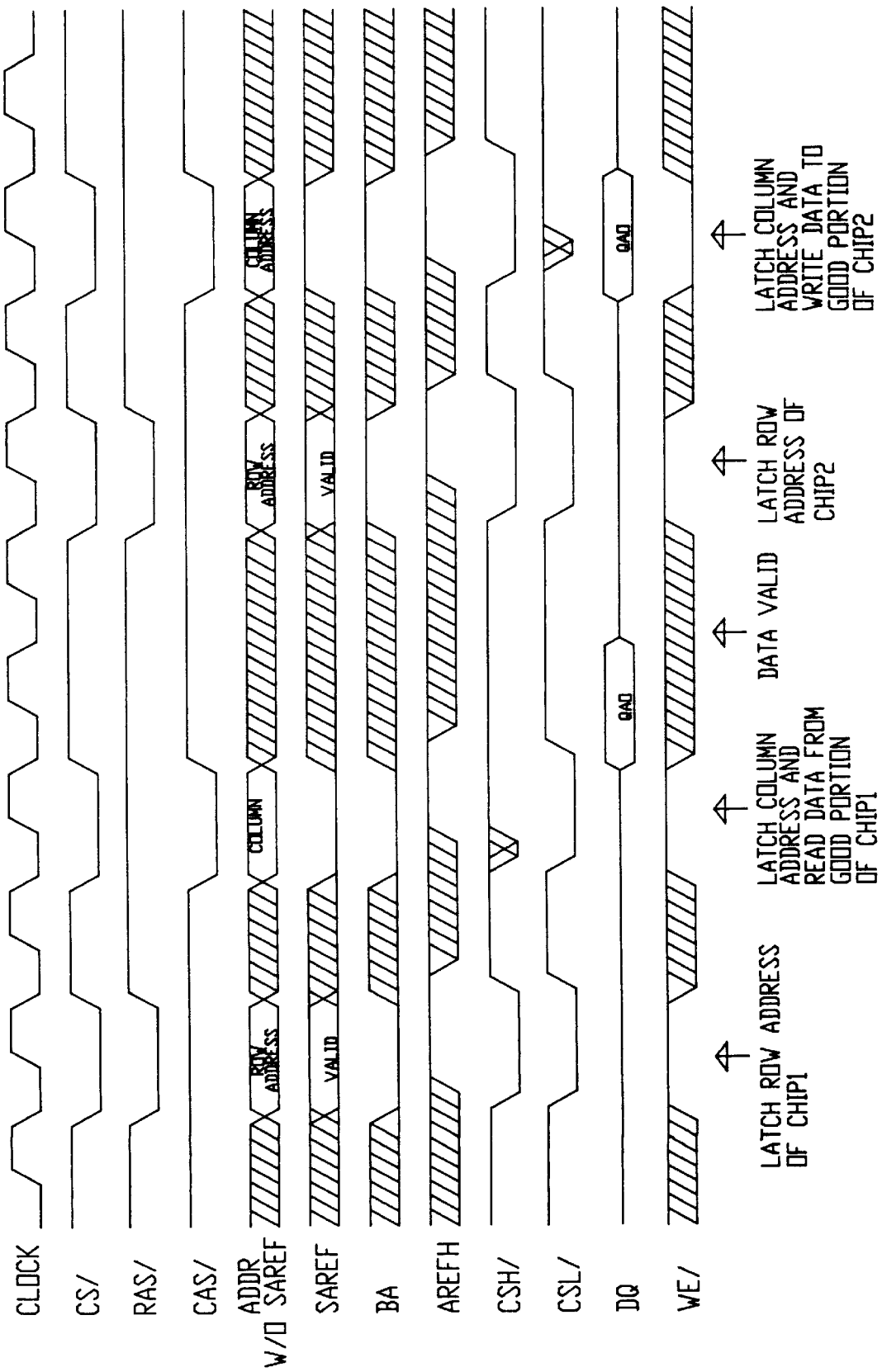
FIG. 17 illustrates a timing diagram of the seventh embodiment operation in accordance with the present invention.

In view of the system 10, workable blocks can be accessed in both the high state and the low state of the SAREF 18g. The chips 12g and 13g are combined as a defect-free chip to the system 10, disregarding of the partial defective blocks. In non-column address accessing cycles, the state of the output signals AREFH and AREFL are equal to the state of the SAREF 18g and the controlling signal CSH/ and CSL/ are equal to the state of the CS/ from the system 10. Therefore, the combined chips can be operated exactly the same as a single chip in the register setting or precharge cycles. The workable block selecting circuit 14g and the chip selecting circuit 16g can be implemented with various kinds of circuits to perform the above-described logic operations to select corresponding chips and workable blocks. The timing diagram of the circuit in FIG. 16 is illustrated in FIG. 17 as a reference.

Figure 18:
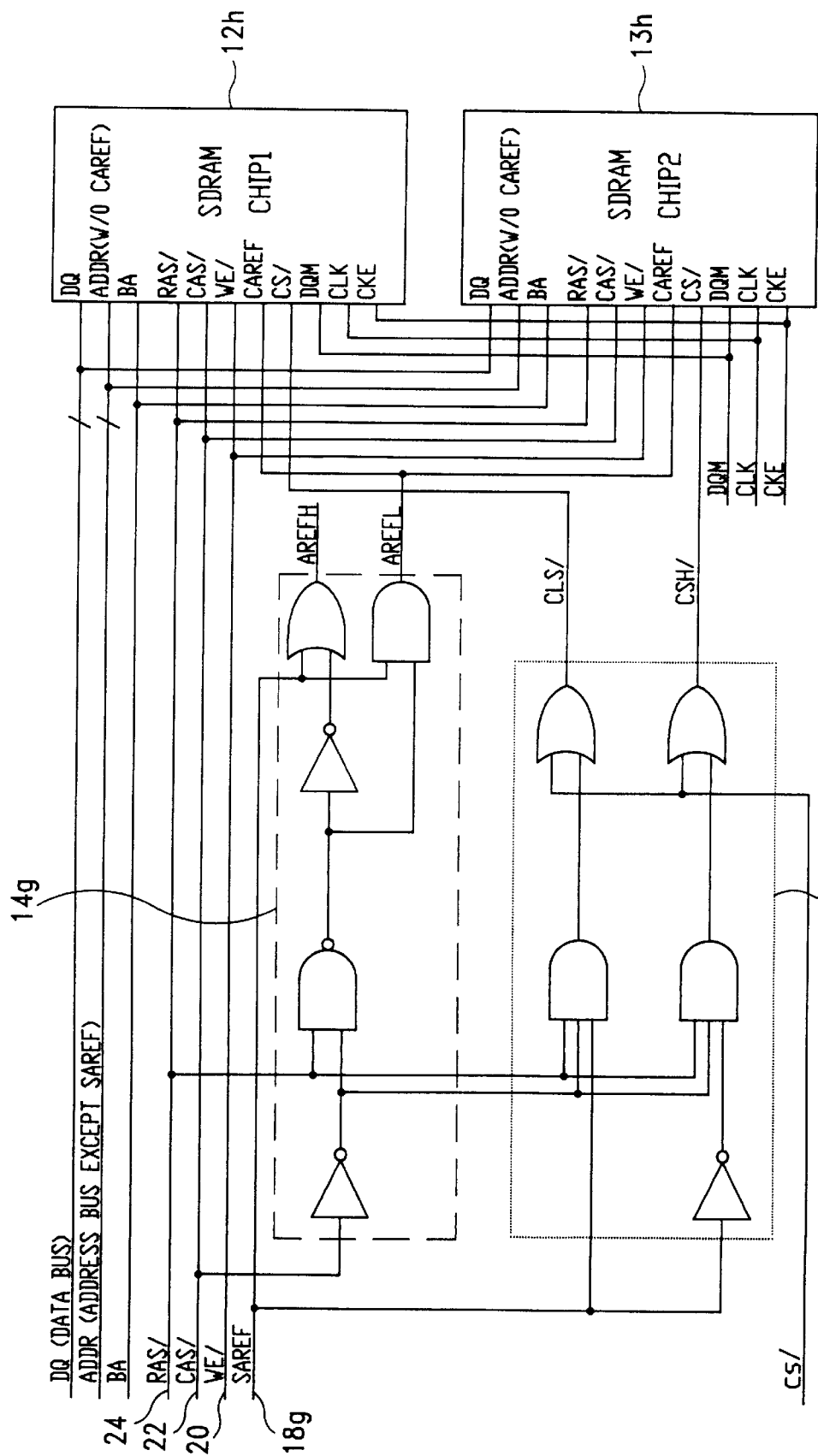
FIG. 18 illustrates a eighth embodiment of the apparatus for combining partially defected synchronous dynamic random access memory chips in accordance with the present invention.

Referring to FIG. 18 as a eighth embodiment, if the two chips 12h and 13h are identified to be operable only when CAREF are low in column address accessing, partial blocks of the two chips are defective. The workable blocks of the two chips 12h and 13h can be selected by connecting a signal AREFL of the workable block selecting circuit 14g to the address reference signal pin, CAREF, of each chip. The address reference signal (SAREF) from the system is used as the reference signal 18g in the case.

Figure 19:
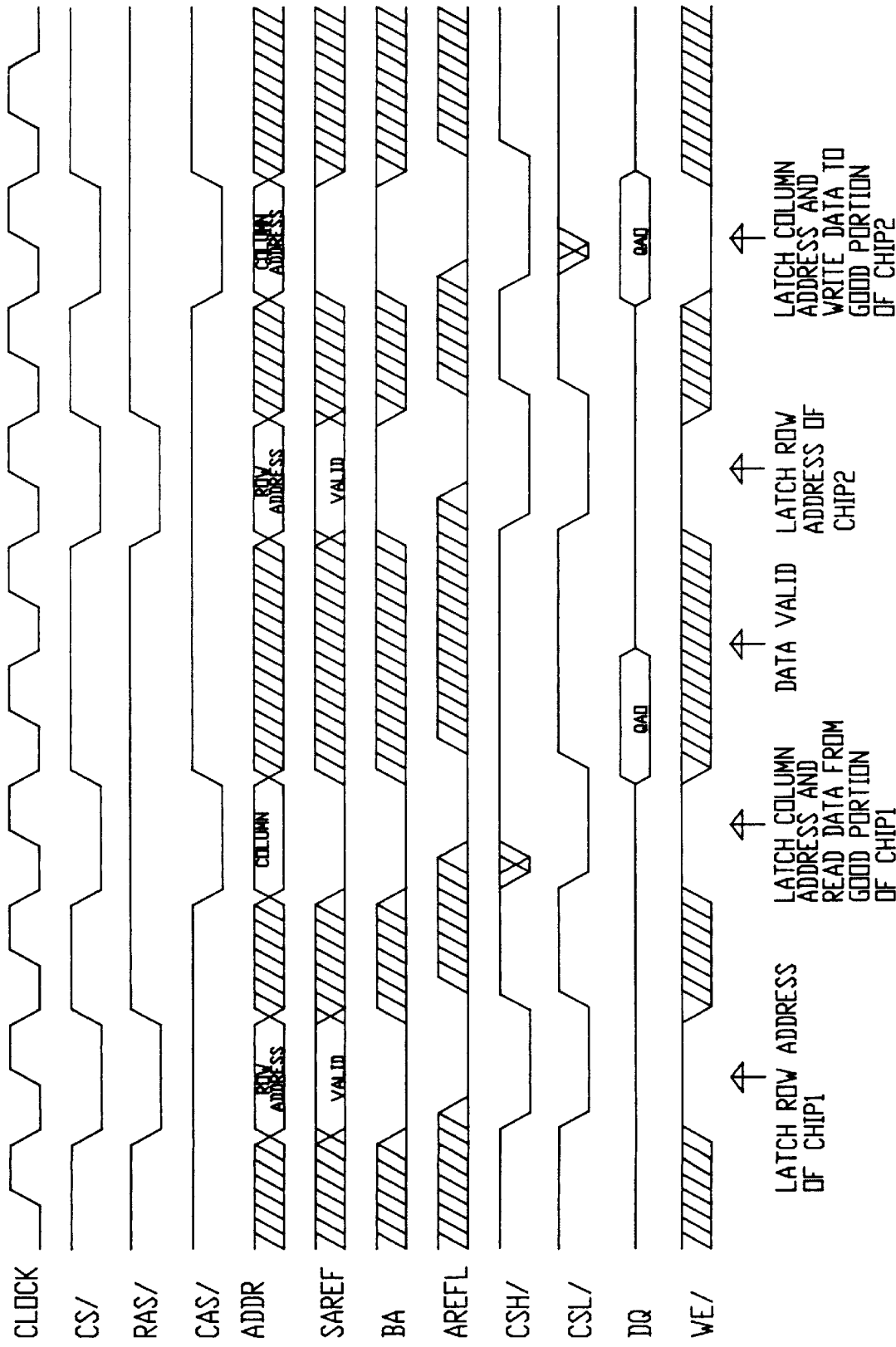
FIG. 19 illustrates a timing diagram of the eighth embodiment operation in accordance with the present invention.

Thus, the workable blocks of the chips 12h and 13h can be activated by the workable block selecting circuit 14g through the signal AREFL in the column address accessing cycle. During the column address accessing cycle, a corresponding chip is selected by the chip selecting circuit 16g at each state of the address reference signal (SAREF) 18g of the system, in the same way as the seventh embodiment in FIG. 16. The operations in non-column address accessing cycles are remained unchanged and thus the combined chips can be operated exactly the same as a single chip in the register setting or precharge cycles. The timing diagram of the circuit in FIG. 18 is illustrated in FIG. 19 as a reference.

Figure 20:
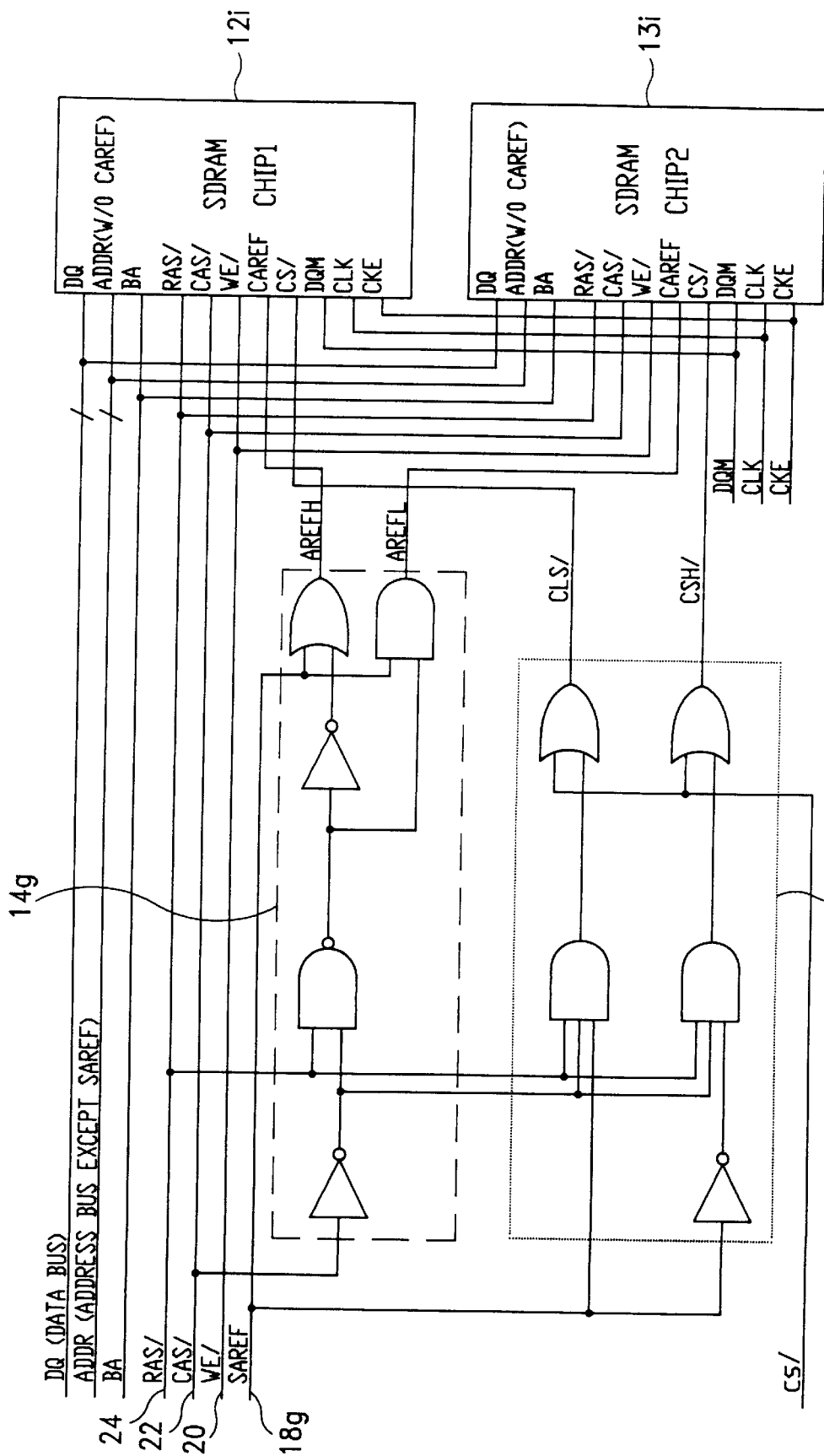
FIG. 20 illustrates a ninth embodiment of the apparatus for combining partially defected synchronous dynamic random access memory chips in accordance with the present invention.

Referring to FIG. 20 as a ninth embodiment, a chip 12i is identified to be operable only when CAREF is high and a chip 13i is identified to be operable only when CAREF is low, both in column address accessing. Partial blocks of the two chips 12f and 13f are known to be defective. The workable block of the chips 12i can be selected by connecting a signal AREFH of the workable block selecting circuit 14g to the address reference signal pin CAREF of the chip 12i. The workable block of the chips 13i can be selected by connecting a signal AREFL of the workable block selecting circuit 14g to the address reference signal pin CAREF of the chip 13i. The address reference signal (SAREF) from the system is used as the reference signal 18g in the case.

Figure 21:
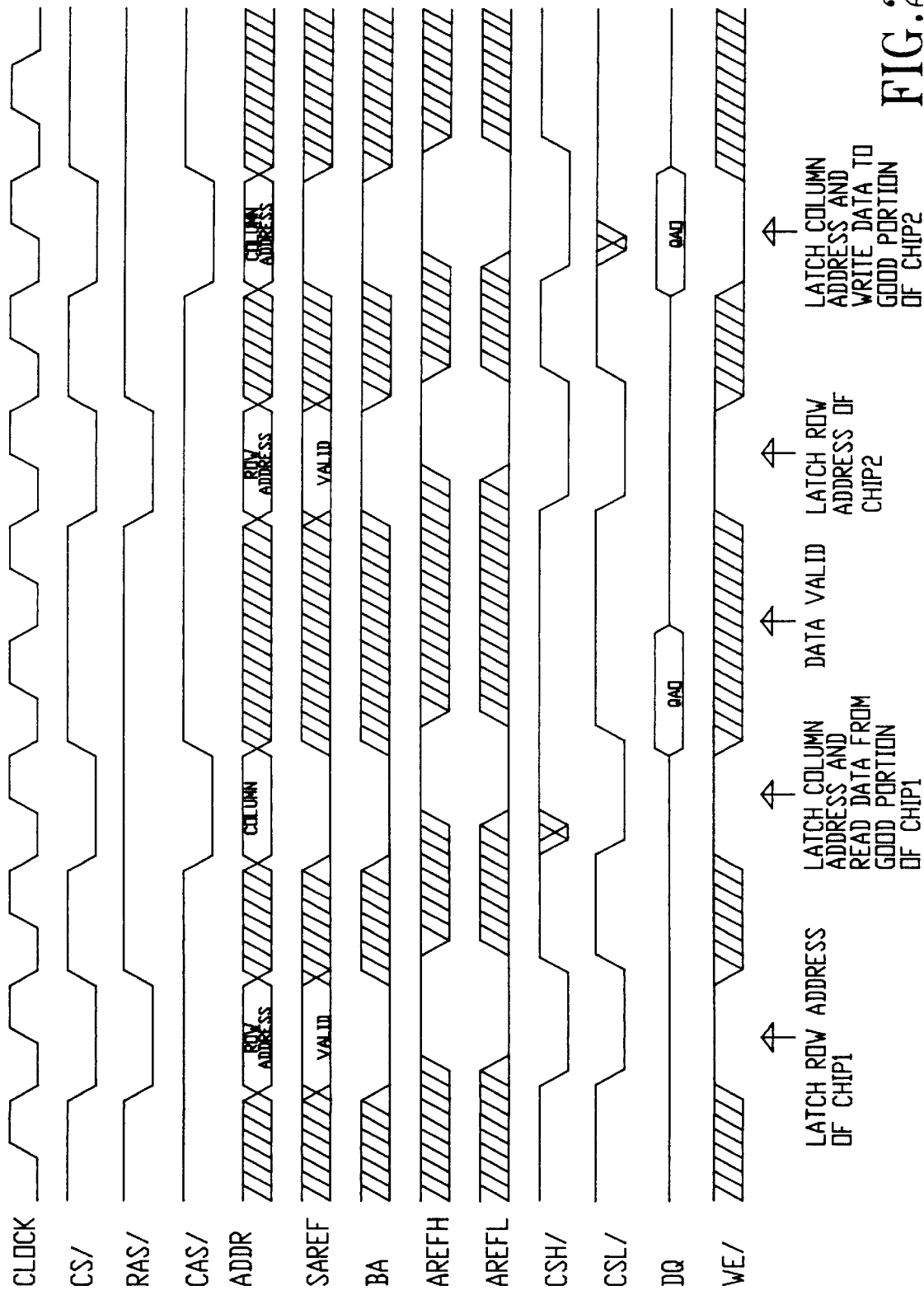
FIG. 21 illustrates a timing diagram of the ninth embodiment operation in accordance with the present invention.

Thus, the workable blocks of the chips 12i and 13i can be activated by the workable block selecting circuit 14g through the signal AREFH and AREFL in the column address accessing cycle. During the column address accessing cycle, a corresponding chip is selected by the chip selecting circuit 16g at each state of the address signal (SAREF) 18g of the system, in the same way as the seventh embodiment in FIG. 16. The operations in non-column address accessing cycles are remained unchanged and thus the combined chips can be operated exactly the same as a single chip in the register setting or precharge cycles. The timing diagram of the circuit in FIG. 20 is illustrated in FIG. 21 as a reference.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded the broadest interpretation so as to encompass all such modifications and similar structures. For a clear illustration of the present invention, the example given are applied on a two bank SDRAMs. The SDRAMs with more banks can be employed alternatively. Since the variation between employing the two bank SDRAMs and the SDRAMs with more bank is well known in the art, the details are not illustrated.

What is claimed is:

1. An apparatus for combining partially defected synchronous dynamic random access memory chips as a functional SDRAM chip, said apparatus comprising:
   a plurality of partially defected synchronous dynamic random access memory chips;
   a reference signal means for generating a reference signal;
   a workable block selecting circuit being responsive to said reference signal for selecting workable blocks of said plurality of partially defected synchronous dynamic random access memory chips; and
   a chip selecting circuit being responsive to a chip selecting signal and said reference signal for selecting a chip from said plurality of partially defected synchronous dynamic random access memory chips to access data as a defect-free chip by said selected workable blocks.

2. The apparatus of claim 1, wherein said workable block selecting circuit is further responsive to a write enable signal, a row address signal, and a column address signal.

3. The apparatus of claim 1, wherein said chip selecting circuit is further responsive to a write enable signal, a row address signal, and a column address signal.

4. The apparatus of claim 1, wherein said reference signal comprises a bank selecting signal.

5. The apparatus of claim 4, wherein at least one workable banks are selected by said workable block selecting circuit in a row address accessing cycle and a column address accessing cycle of said plurality of partially defected synchronous dynamic random access memory chips.

6. The apparatus of claim 5, wherein a chip of said plurality of partially defected synchronous dynamic random access memory chips is selected by said chip selecting circuit corresponding to each state of said bank selecting signal, during said row address accessing cycle and said column address accessing cycle.

7. The apparatus of claim 1, wherein each of said plurality of partially defected synchronous dynamic random access memory chips are partially defective in a row address accessing cycle.

8. The apparatus of claim 7, wherein said reference signal comprises an address reference signal of row addresses.

9. The apparatus of claim 8, wherein said workable blocks are selected by said workable block selecting circuit in said row address accessing cycle.

10. The apparatus of claim 9, wherein a chip of said plurality of partially defected synchronous dynamic random access memory chips is selected by said chip selecting circuit corresponding to each state of said address reference signal, during said row address accessing cycle.

11. The apparatus of claim 1, wherein each of said plurality of partially defected synchronous dynamic random access memory chips are partially defective in a column address accessing cycle.

12. The apparatus of claim 11, wherein said reference signal comprises an address reference signal of column addresses.

13. The apparatus of claim 12, wherein said workable blocks are selected by said workable block selecting circuit in said column address accessing cycle.

14. The apparatus of claim 13, wherein a chip of said plurality of partially defected synchronous dynamic random access memory chips is selected by said chip selecting circuit corresponding to each state of said address reference signal, during said column address accessing cycle.

15. A method for combining a plurality of partially defected synchronous dynamic random access memory chips as a functional SDRAM chip, comprising the steps of:

provideing a plurality of partially defected synchronous dynamic random access memory chips;

inputting a reference signal to a workable block selecting circuit for generating a workable block selecting signal;

selecting workable blocks of said plurality of partially defected synchronous dynamic random access memory chips in response to said workable block selecting signal;

inputting a chip selecting signal and said reference signal to said chip selecting circuit for generating a controlling signal;

selecting a chip from said plurality of partially defected synchronous dynamic random access memory chips in response to said controlling signal; and combining said workable block selecting signal and said controlling signal to activate said selected workable block of said selected chip for data access.

16. The method of claim 15, further comprising a step of inputting a write enable signal, a row address signal, and a column address signal to said workable black selecting circuit and said partially defected synchronous dynamic random access memory chips.

17. The method of claim 15, wherein said reference signal comprises a bank selecting signal.

18. The method of claim 15, wherein said reference signal comprises an address reference signal of row addresses.

19. The method of claim 15, wherein said reference signal comprises an address reference signal of column addresses.

* * * * *